(12) United States Patent
Higashi et al.

(10) Patent No.: US 11,333,978 B2
(45) Date of Patent: May 17, 2022

(54) ACTINIC RAY-SENSITIVE OR RADIATION-SENSITIVE RESIN COMPOSITION, RESIST FILM, PATTERN FORMING METHOD, AND METHOD FOR MANUFACTURING SOLID-STATE IMAGING ELEMENT

(71) Applicant: FUJIFILM Corporation, Tokyo (JP)

(72) Inventors: Kohei Higashi, Shizuoka (JP); Hideki Takakuwa, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 68 days.

(21) Appl. No.: 16/730,384

(22) Filed: Dec. 30, 2019

(65) Prior Publication Data

US 2020/0142306 A1    May 7, 2020

Related U.S. Application Data

(63) Continuation of application No. PCT/JP2018/027574, filed on Jul. 23, 2018.

(30) Foreign Application Priority Data

Aug. 31, 2017 (JP) .................... JP2017-167720 JP

(51) Int. Cl.
| | |
|---|---|
| *H01L 21/00* | (2006.01) |
| *G03F 7/038* | (2006.01) |
| *G02B 5/20* | (2006.01) |
| *G03F 7/004* | (2006.01) |
| *G03F 7/039* | (2006.01) |
| *H01L 27/146* | (2006.01) |
| *G03F 7/16* | (2006.01) |
| *G03F 7/20* | (2006.01) |
| *G03F 7/32* | (2006.01) |
| *G03F 7/38* | (2006.01) |
| *G03F 7/40* | (2006.01) |

(52) U.S. Cl.
CPC .......... *G03F 7/0382* (2013.01); *G02B 5/208* (2013.01); *G03F 7/0045* (2013.01); *G03F 7/0392* (2013.01); *H01L 27/1462* (2013.01); *H01L 27/14685* (2013.01); *G03F 7/162* (2013.01); *G03F 7/168* (2013.01); *G03F 7/2006* (2013.01); *G03F 7/322* (2013.01); *G03F 7/38* (2013.01); *G03F 7/40* (2013.01)

(58) Field of Classification Search
CPC .... G03F 7/0382; G03F 7/0045; G03F 7/0392; G03F 7/162; G03F 7/168; G03F 7/2006; G03F 7/322; G03F 7/38; G03F 7/40; G02B 5/208; H01L 27/1462; H01L 27/14685; H01L 21/0415; H01L 21/046–047; H01L 21/2253; H01L 21/265–266; H01L 21/3115–31155; H01L 21/3215–32155; H01L 21/425–426; H01L 21/76825; H01L 21/76859; H01L 21/76862; H01L 21/0271–0279; H01L 21/312–3128; H01L 21/027–0338; H01L 21/32; C23C 14/48
USPC .......................................................... 438/69
See application file for complete search history.

(56) References Cited

U.S. PATENT DOCUMENTS

| | | | |
|---|---|---|---|
| 2009/0023102 A1 | 1/2009 | Shimbori et al. | |
| 2010/0032569 A1* | 2/2010 | Kita ....................... | G01J 1/4228 250/338.4 |
| 2015/0380450 A1 | 12/2015 | Okamoto et al. | |
| 2016/0018732 A1 | 1/2016 | Yamaguchi et al. | |
| 2016/0131976 A1 | 5/2016 | Tsuchimura et al. | |
| 2016/0223905 A1 | 8/2016 | Ou et al. | |
| 2018/0299777 A1* | 10/2018 | Tomiga ................. | G03F 7/2006 |

FOREIGN PATENT DOCUMENTS

| | | |
|---|---|---|
| CN | 105637417 A | 6/2016 |
| JP | 11-265067 A | 9/1999 |
| JP | 2007-206425 A | 8/2007 |
| JP | 2012-019113 A | 1/2012 |
| JP | 2012-098520 A | 5/2012 |
| JP | 4954576 B2 | 6/2012 |
| JP | 2014-199273 A | 10/2014 |
| JP | 2015-022074 A | 2/2015 |
| JP | 2015-068850 A | 4/2015 |
| JP | 2015-127797 A | 7/2015 |
| JP | 2017-143192 A | 8/2017 |
| KR | 10-2016-0001673 A | 1/2016 |
| WO | 2017/110352 A1 | 6/2017 |
| WO | WO-2017110352 A1 * | 6/2017 ............. G03F 7/162 |

OTHER PUBLICATIONS

Office Action dated Jun. 16, 2020 in Japanese Application No. 2019-539065.
Communication dated Jan. 26, 2021 in corresponding Japanese Application No. 2019-539065.
International Search Report dated Sep. 25, 2018, issued by the International Searching Authority in application No. PCT/JP2018/027574.
Written Opinion dated Sep. 25, 2018, issued by the International Searching Authority in application No. PCT/JP2018/027574.

(Continued)

*Primary Examiner* — Calvin Y Choi
(74) *Attorney, Agent, or Firm* — Sughrue Mion, PLLC

(57) ABSTRACT

An actinic ray-sensitive or radiation-sensitive resin composition for forming a pattern used as a mask in an ion implanting, including a resin including a repeating unit having an acid-decomposable group, a photoacid generator, and an additive having a melting point or glass transition temperature of lower than 25° C. and a molecular weight of 180 or more, in which a content of the additive is 1% by mass or more with respect to a total solid content in the composition.

17 Claims, No Drawings

(56) References Cited

OTHER PUBLICATIONS

International Preliminary Report on Patentability dated Mar. 3, 2020, issued by the International Bureau in application No. PCT/JP2018/027574.
Office Action dated Jul. 30, 2021 from the Taiwanese Patent Office in Taiwanese Application No. 107126458.
Office Action dated Aug. 3, 2021 from the Korean Intellectual Property Office in Korean Application No. 10-2020-7000417.
Office Action dated Feb. 10, 2022 from the Korean Intellectual Property Office in KR Application No. 10-2020-7000417.

* cited by examiner

ACTINIC RAY-SENSITIVE OR RADIATION-SENSITIVE RESIN COMPOSITION, RESIST FILM, PATTERN FORMING METHOD, AND METHOD FOR MANUFACTURING SOLID-STATE IMAGING ELEMENT

CROSS-REFERENCE TO RELATED APPLICATIONS

This application is a Continuation of PCT International Application No. PCT/JP2018/27574, filed on Jul. 23, 2018, which claims priority under 35 U.S.C. § 119(a) to Japanese Patent Application No. 2017-167720, filed on Aug. 31, 2017. Each of the above application(s) is hereby expressly incorporated by reference, in its entirety, into the present application.

BACKGROUND OF THE INVENTION

1. Field of the Invention

The present invention relates to an actinic ray-sensitive or radiation-sensitive resin composition, a resist film, a pattern forming method, and a method for manufacturing a solid-state imaging element.

2. Description of the Related Art

A charge-coupled device (CCD) or a complementary metal-oxide semiconductor (CMOS), which is a solid-state imaging element for color images, has been used for video cameras, digital still cameras, mobile phones equipped with a camera function, and the like.

The solid-state imaging element has light receiving portions which are two-dimensionally arrayed, and generates an electric image signal by photoelectrically converting incident light in the light receiving portion. The light receiving portion itself further has a sensitivity to the near infrared region at a long wavelength (a wavelength of up to about 2,500 nm), in addition to the overall visible region (380 nm to 780 nm). The solid-state imaging element further includes a plurality of kinds of color filter layers having different transmission wavelength ranges, an infrared transmitting filter layer, and the like on a light receiving surface.

Meanwhile, a semiconductor substrate in which a power storage layer having sensitivity to a predetermined wavelength is formed has been used in the light receiving portion. The power storage layer is typically formed by forming a pattern on a semiconductor substrate with a resist composition and implanting ions (impurities) into the unmasked region of the semiconductor substrate through the pattern as a mask using an ion implantation device. Above all, in order to obtain a light receiving portion having sufficient sensitivity to long-wavelength light such as infrared rays, it is necessary to carry out ion implantation (hereinafter also referred to as "ion implantation") with high energy so as to implant the impurities into a deep position of the semiconductor substrate. A pattern of a thick film is used at the time of carrying out the ion implantation with high energy.

For example, JP4954576B discloses, as a resist composition which can form a pattern of a thick film, "a positive-tone resist composition which is a resist composition for forming a thick resist film having a film thickness of 1 to 15 µm, in which the positive-tone resist composition is formed by dissolving a resin component (A) whose alkali solubility increases by the action of an acid and an acid generator component (B) that generates an acid upon exposure in an organic solvent (S), and the organic solvent (S) is a mixed solvent of 10% to 95% by mass of propylene glycol monomethyl ether and 5% to 90% by mass of another solvent (S2).

SUMMARY OF THE INVENTION

The present inventors have made attempts to implant ion (impurities) into a semiconductor substrate through a pattern of a thick film formed with the positive-tone resist composition described in JP4954576B as a mask. As a result, it was confirmed that ion leakage occurs in the masked region of the semiconductor substrate in a case where the ions are implanted into a depth capable of imparting practically sufficient sensitivity to infrared rays. That is, it was confirmed that emitted ions were transmitted through the mask and also implanted into the semiconductor substrate under the mask.

Therefore, an object of the present invention is to provide an actinic ray-sensitive or radiation-sensitive resin composition which can form a pattern capable of suppressing ion leakage in an ion implanting step.

Furthermore, another object of the present invention is to provide a resist film and a pattern forming method, each using the actinic ray-sensitive or radiation-sensitive resin composition.

In addition, still another object of the present invention is to provide a method for manufacturing a solid-state imaging element, the method using the pattern forming method.

The present inventors have conducted extensive studies to achieve the objects, and as a result, they have found that the objects can be achieved by incorporating a predetermined additive into the actinic ray-sensitive or radiation-sensitive resin composition, thereby completing the present invention.

That is, the present inventors have found that the objects can be achieved by the following constitutions.

[1] An actinic ray-sensitive or radiation-sensitive resin composition for forming a pattern used as a mask in an ion implanting, comprising:
a resin including a repeating unit having an acid-decomposable group;
a photoacid generator; and
an additive having a melting point or glass transition temperature of lower than 25° C. and a molecular weight of 180 or more,
in which a content of the additive is 1% by mass or more with respect to a total solid content in the composition.

[2] The actinic ray-sensitive or radiation-sensitive resin composition as described in [1],
in which a film thickness of the pattern is 5 µm or more.

[3] The actinic ray-sensitive or radiation-sensitive resin composition as described in [1] or [2],
in which a film thickness of the pattern is 7 µm or more.

[4] The actinic ray-sensitive or radiation-sensitive resin composition as described in any one of [1] to [3],
in which a concentration of the solid content in the composition is 20% by mass or more.

[5] The actinic ray-sensitive or radiation-sensitive resin composition as described in any one of [1] to [4],
in which a film density of a film having a film thickness of 9 µm obtained by applying the actinic ray-sensitive or radiation-sensitive resin composition onto a substrate to form a coating film, and then baking the coating film at 150° C. for 90 seconds is 1.05 g/cm³ or more.

[6] The actinic ray-sensitive or radiation-sensitive resin composition as described in [5],
in which the film density is 1.10 g/cm³ or more.

[7] The actinic ray-sensitive or radiation-sensitive resin composition as described in any one of [1] to [6],
in which a glass transition temperature of the resin is 170° C. or lower.

[8] The actinic ray-sensitive or radiation-sensitive resin composition as described in any one of [1] to [7],
in which the additive is water-soluble.

[9] The actinic ray-sensitive or radiation-sensitive resin composition as described in any one of [1] to [8],
in which the ion implanting is an ion implanting for forming a light receiving portion for an infrared transmitting filter that selectively transmits an infrared ray component in a manufacture of a solid-state imaging element including the infrared transmitting filter.

[10] A resist film formed with the actinic ray-sensitive or radiation-sensitive resin composition as described in any one of [1] to [9].

[11] A pattern forming method comprising:
forming a resist film with the actinic ray-sensitive or radiation-sensitive resin composition as described in any one of [1] to [9];
exposing the resist film; and
developing the exposed resist film with a developer.

[12] A method for manufacturing a solid-state imaging element, the method comprising:
the pattern forming method as described in [11], and
an ion implanting of forming a light receiving portion that senses infrared rays, by implanting ions into an unmasked region of a substrate with a pattern formed on the substrate as a mask;
removing the pattern from the substrate; and
disposing an infrared transmitting filter layer on an ion-implanted region of the substrate.

According to the present invention, it is possible to provide an actinic ray-sensitive or radiation-sensitive resin composition which can form a pattern capable of suppressing ion leakage in an ion implanting step.

Furthermore, according to the present invention, it is possible to provide a resist film and a pattern forming method, each using the actinic ray-sensitive or radiation-sensitive resin composition.

In addition, according to the present invention, it is possible to provide a method for manufacturing a solid-state imaging element, the method using the pattern forming method.

DESCRIPTION OF THE PREFERRED EMBODIMENTS

Hereinafter, the present invention will be described in detail.

Description of configuration requirements described below may be made on the basis of representative embodiments of the present invention in some cases, but the present invention is not limited to such embodiments.

"Actinic rays" or "radiation" in the present specification means, for example, a bright line spectrum of a mercury lamp, far ultraviolet rays typified by an excimer laser, extreme ultraviolet rays (EUV rays), X-rays, electron beams (EB), or the like. "Light" in the present specification means actinic rays or radiation.

"Exposure" in the present specification encompasses, unless otherwise specified, not only exposure by a bright line spectrum of a mercury lamp, far ultraviolet rays typified by an excimer laser, extreme ultraviolet rays, X-rays, EUV rays, or the like, but also lithography by particle rays such as electron beams and ion beams.

In the present specification, a numerical range expressed using "to" is used in a meaning of a range that includes the preceding and succeeding numerical values of "to" as the lower limit value and the upper limit value, respectively.

In the present specification, "(meth)acrylate" represents acrylate and methacrylate.

In the present specification, the weight-average molecular weight (Mw), the number-average molecular weight (Mn), and the dispersity (hereinafter also referred to as a "molecular weight distribution") (Mw/Mn) of a resin are defined as values in terms of polystyrene by means of gel permeation chromatography (GPC) measurement (solvent: tetrahydrofuran, flow amount (amount of a sample injected): 10 μL, columns: TSK gel Multipore HXL-M manufactured by Tosoh Corporation, column temperature: 40° C., flow rate: 1.0 mL/min, detector: differential refractive index detector) using a GPC apparatus (HLC-8120 GPC manufactured by Tosoh Corporation).

In citations for a group (atomic group) in the present specification, in a case where the group is cited without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group). In addition, an "organic group" in the present specification refers to a group including at least one carbon atom.

Furthermore, in the present specification, in a case of referring to an expression "a substituent may be contained", the types of substituents, the positions of the substituents, and the number of the substituents are not particularly limited. The number of the substituents may be, for example, one, two, three, or more. Examples of the substituent include a monovalent non-metal atomic group except for a hydrogen atom, and the substituent can be selected from, for example, the following substituent group T.

(Substituent T)

Examples of the substituent T include halogen atoms such as a fluorine atom, a chlorine atom, a bromine atom, and an iodine atom; alkoxy groups such as a methoxy group, an ethoxy group, and a tert-butoxy group; aryloxy groups such as a phenoxy group and a p-tolyloxy group; alkoxycarbonyl groups such as a methoxycarbonyl group, a butoxycarbonyl group, and a phenoxycarbonyl group; acyloxy groups such as an acetoxy group, a propionyloxy group, and a benzoyloxy group; acyl groups such as an acetyl group, a benzoyl group, an isobutyryl group, an acryloyl group, a methacryloyl group, and a methoxalyl group; alkylsulfanyl groups such as a methylsulfanyl group and a tert-butylsulfanyl group; arylsulfanyl groups such as a phenylsulfanyl group and a p-tolylsulfanyl group; an alkyl group; a cycloalkyl group; an aryl group; a heteroaryl group; a hydroxyl group; a carboxyl group; a formyl group; a sulfo group; a cyano group; an alkylaminocarbonyl group; an arylaminocarbonyl group; a sulfonamido group; a silyl group; an amino group; a monoalkylamino group; a dialkylamino group; an arylamino group; and a combination thereof.

[Actinic Ray-Sensitive or Radiation-Sensitive Resin Composition]

The actinic ray-sensitive or radiation-sensitive resin composition of an embodiment of the present invention may include specific additives in a predetermined amount with respect to a total solid content in the composition.

The present inventors have confirmed that residual solvents remaining within a pattern formed with the actinic ray-sensitive or radiation-sensitive resin composition are involved with a problem of ion leakage. Specifically, it is considered that as more residual solvents remain within the pattern, a film density of the pattern is further reduced, which results in occurrence of ion leakage in the ion implanting step.

The present inventors have solved the problems as discovered above by incorporating a predetermined amount of the above-mentioned specific additive into the actinic ray-sensitive or radiation-sensitive resin composition. The specific additive has an action of improving the plasticity of a resist film with regard to the resist film (in other words, a coating film of the actinic ray-sensitive or radiation-sensitive resin composition). In this regard, it is presumed that the residual solvents in the resist film are likely to be volatilized due to the presence of the specific additives, and as a result, the film density of a pattern thus formed is excellent.

With a pattern formed from the actinic ray-sensitive or radiation-sensitive resin composition of the embodiment of the present invention, ion leakage can be suppressed even in a case where ions are implanted with high energy in the ion implanting step, by the mechanism of action.

Hereinafter, the components included in the actinic ray-sensitive or radiation-sensitive resin composition of the embodiment of the present invention (hereinafter also referred to as "the composition of the embodiment of the present invention") will be described in details. Incidentally, the composition of the embodiment of the present invention is a so-called resist composition, and may be either a positive-tone resist composition or a negative-tone resist composition. In addition, the composition may be either a resist composition for alkali development or a resist composition for organic solvent development. Among those, the positive-tone resist composition, which is a resist composition for alkali development, is preferable.

The composition of the embodiment of the present invention is typically a chemically amplified resist composition.

<Resin (A)>

The composition of the embodiment of the present invention includes a resin including a repeating unit having an acid-decomposable group (hereinafter also referred to as a "resin (A)").

In this case, in the pattern forming method of the embodiment of the present invention, typically, in a case where an alkali developer is adopted as the developer, a positive-tone pattern is suitably formed, and in a case where an organic developer is adopted as the developer, a negative-tone pattern is suitably formed.

Moreover, from the viewpoint that the film density of a pattern thus formed is more excellent and the ion leakage in an ion implanting step is further suppressed, the glass transition temperature (Tg (° C.)) of the resin (A) is preferably 170° C. or lower, and more preferably 140° C. or lower. In addition, a lower limit value of the glass transition temperature of the resin (A) is usually 100° C. or higher.

Furthermore, as a glass transition temperature of the resin (A), in a case where there is either a catalog value or a literature value, the value is employed, and in a case where there is not such a value, the glass transition temperature can be measured by a differential scanning calorimetry (DSC) method.

Moreover, in a case where the resin (A) is a copolymer and there is neither a catalog value nor a literature value, the glass transition temperature can be calculated by Formula (1).

$$1/(273+Tg) = \Sigma(Wi/(273+Tgi))$$ Formula (1)

Tg: Glass transition temperature (° C.) of the resin (A)
Tgi: Glass transition temperature (° C.) of a homopolymer of each monomer i
Wi: Mass proportion of monomer i. Further, $\Sigma Wi$ is 1.

(Repeating Unit Having Acid-Decomposable Group)

The resin (A) includes a repeating unit having an acid-decomposable group (hereinafter also referred to as a "repeating unit X1").

As the acid-decomposable group, a group that decomposes by the action of an acid to generate a polar group is preferable.

Examples of the polar group an acidic group (a group that dissociates in a 2.38%-by-mass aqueous tetramethylammonium hydroxide solution such as a carboxyl group, a phenolic hydroxyl group, a fluorinated alcohol group, a sulfonic acid group, a sulfonamide group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group, and an alcoholic hydroxyl group.

Furthermore, the alcoholic hydroxyl group refers to a hydroxyl group bonded to a hydrocarbon group, which is a hydroxyl group other than a hydroxyl group (phenolic hydroxyl group) directly bonded to an aromatic ring, from which an aliphatic alcohol (for example, a hexafluoroisopropanol group) having the α-position substituted with an electron withdrawing group such as a fluorine atom is excluded as a hydroxyl group. The alcoholic hydroxyl group is preferably a hydroxyl group having an acid dissociation constant (pKa) from 12 to 20.

Preferred examples of the polar group include a carboxyl group, a phenolic hydroxyl group, a fluorinated alcohol group (preferably a hexafluoroisopropanol group), and a sulfonic acid group.

A group which is preferable as the acid-decomposable group is a group in which a hydrogen atom of the polar group is substituted with a group (leaving group) that leaves by the action of an acid.

Examples of the group (leaving group) that leaves by an acid include —C($R_{36}$)($R_{37}$)($R_{38}$), —C($R_{36}$)($R_{37}$)(O$R_{39}$), and —C($R_{01}$)($R_{02}$)(O$R_{39}$).

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

As the alkyl group as each of $R_{36}$ to $R_{39}$, $R_{01}$, and $R_{02}$, an alkyl group having 1 to 8 carbon atoms is preferable, and examples thereof include a methyl group, an ethyl group, a propyl group, an n-butyl group, a sec-butyl group, a hexyl group, and an octyl group.

The cycloalkyl group as each of $R_{36}$ to $R_{39}$, $R_{01}$, and $R_{02}$ may be either a monocycle or polycycle. As the monocyclic cycloalkyl group, a cycloalkyl group having 3 to 8 carbon atoms is preferable, and examples thereof include a cyclopropyl group, a cyclobutyl group, a cyclopentyl group, a cyclohexyl group, and a cyclooctyl group. As the polycyclic cycloalkyl group, a cycloalkyl group having 6 to 20 carbon atoms is preferable, and examples thereof include an adamantyl group, a norbornyl group, an isobornyl group, a camphanyl group, a dicyclopentyl group, an α-pinel group, a tricyclodecanyl group, a tetracyclododecyl group, and an androstanyl group. Further, at least one carbon atom in the cycloalkyl group may be substituted with heteroatoms such as an oxygen atom.

The aryl group as each of $R_{36}$ to $R_{39}$, $R_{01}$, and $R_{02}$ is preferably an aryl group having 6 to 10 carbon atoms, and examples thereof include a phenyl group, a naphthyl group, and an anthryl group.

The aralkyl group as each of $R_{36}$ to $R_{39}$, $R_{01}$, and $R_{02}$ is preferably an aralkyl group having 7 to 12 carbon atoms, and examples thereof include a benzyl group, a phenethyl group, and a naphthylmethyl group.

The alkenyl group as each of $R_{36}$ to $R_{39}$, $R_{01}$, and $R_{02}$ is preferably an alkenyl group having 2 to 8 carbon atoms, and examples thereof include a vinyl group, an allyl group, a butenyl group, and a cyclohexenyl group.

The ring formed by the bonding of $R_{36}$ and $R_{37}$ is preferably a (monocyclic or polycyclic) cycloalkyl group. As the cycloalkyl group, monocyclic cycloalkyl groups such as a cyclopentyl group and a cyclohexyl group, and polycyclic cycloalkyl groups such as a norbornyl group, a tetracyclodecanyl group, a tetracyclododecanyl group, and an adamantyl group are preferable.

As the acid-decomposable group, a cumyl ester group, an enol ester group, an acetal group, or a tertiary alkyl ester group is preferable, and the acetal group or the tertiary alkyl ester group is more preferable.

Repeating Unit Having Structure (Acid-Decomposable Group) in which —COOH Group is Protected with Leaving Group The resin (A) preferably has a repeating unit represented by General Formula (AI) as the repeating unit X1.

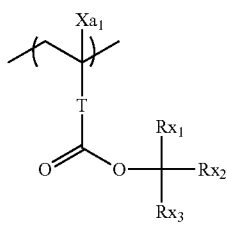

(AI)

In General Formula (AI), $Xa_1$ represents a hydrogen atom, a halogen atom, or a monovalent organic group.

T represents a single bond or a divalent linking group.

$Rx_1$ to $Rx_3$ each independently represent an alkyl group or a cycloalkyl group.

Any two of $Rx_1$ to $Rx_3$ may or may not be bonded to each other to form a ring structure.

Examples of the divalent linking group of T include an alkylene group, an arylene group, —COO-Rt-, and —O-Rt-. In the formula, Rt represents an alkylene group, a cycloalkylene group, or an arylene group.

T is preferably a single bond or —COO-Rt-. Rt is preferably a chained alkylene group having 1 to 5 carbon atoms, and more preferably —CH$_2$—, —(CH$_2$)$_2$—, or —(CH$_2$)$_3$—. T is more preferably the single bond.

$Xa_1$ is preferably a hydrogen atom or an alkyl group.

The alkyl group of $Xa_1$ may have a substituent, and examples of the substituent include a hydroxyl group and a halogen atom (preferably a fluorine atom).

The alkyl group of $Xa_1$ preferably has 1 to 4 carbon atoms, and examples thereof include a methyl group, an ethyl group, a propyl group, a hydroxymethyl group, and a trifluoromethyl group. The alkyl group of $Xa_1$ is preferably the methyl group.

The alkyl group of each of $Rx_1$, $Rx_2$, and $Rx_3$ may be linear or branched, and is preferably a methyl group, an ethyl group, an n-propyl group, an isopropyl group, an n-butyl group, an isobutyl group, a t-butyl group, or the like. The number of the carbon atoms of the alkyl group is preferably 1 to 10, more preferably 1 to 5, and still more preferably 1 to 3. Some of carbon-carbon bonds in the alkyl group of each of $Rx_1$, $Rx_2$, and $Rx_3$ may be double bonds.

The cycloalkyl group of each of $Rx_1$, $Rx_2$, and $Rx_3$ is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group.

As the ring structure formed by the bonding of two of $Rx_1$, $Rx_2$, and $Rx_3$, a monocyclic cycloalkane ring such as a cyclopentyl ring, a cyclohexyl ring, a cycloheptyl ring, and a cyclooctane ring, and a polycyclic cycloalkyl ring such as a norbornane ring, a tetracyclodecane ring, a tetracyclododecane ring, and an adamantane ring are preferable. Among those, the cyclopentyl ring, the cyclohexyl ring, or the adamantane ring is more preferable. As the ring structure formed by the bonding of two of $Rx_1$, $Rx_2$, and $Rx_3$, a structure set forth below is also preferable.

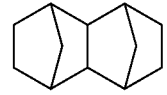

Specific examples of a monomer corresponding to the repeating unit represented by General Formula (AI) are set forth below, but the present invention is not limited to these specific examples. The following specific examples correspond to a case where $Xa_1$ in General Formula (AI) is a methyl group, but $Xa_1$ can be optionally substituted with a hydrogen atom, a halogen atom, or a monovalent organic group.

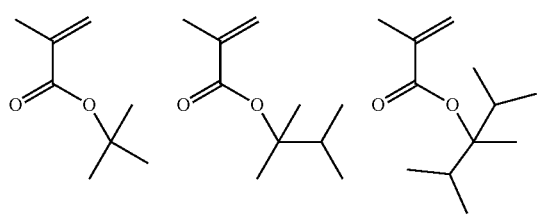

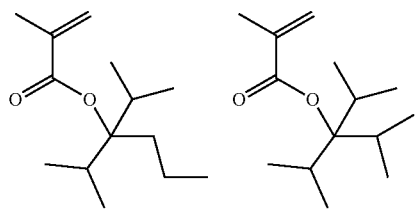

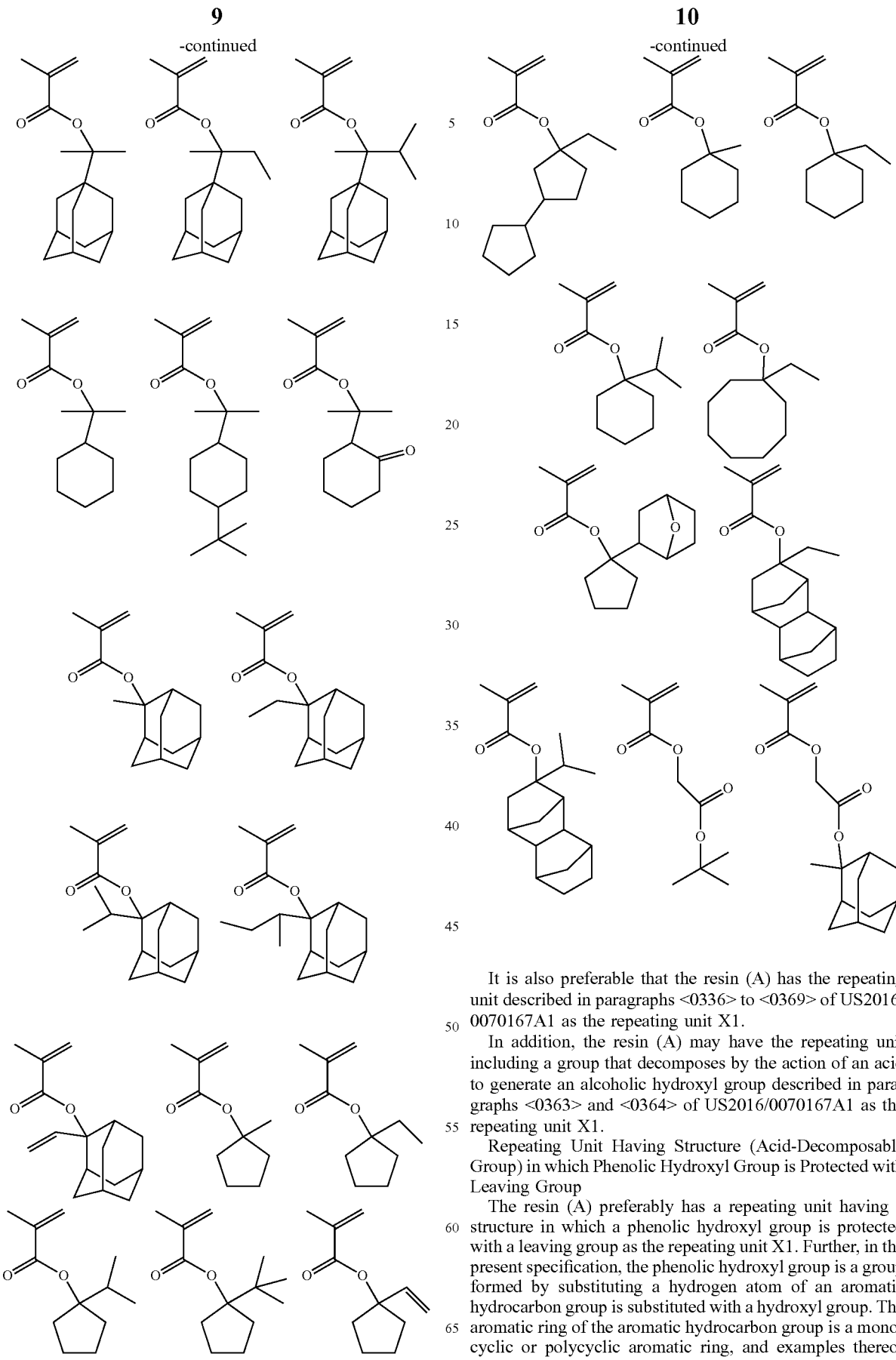

It is also preferable that the resin (A) has the repeating unit described in paragraphs <0336> to <0369> of US2016/0070167A1 as the repeating unit X1.

In addition, the resin (A) may have the repeating unit including a group that decomposes by the action of an acid to generate an alcoholic hydroxyl group described in paragraphs <0363> and <0364> of US2016/0070167A1 as the repeating unit X1.

Repeating Unit Having Structure (Acid-Decomposable Group) in which Phenolic Hydroxyl Group is Protected with Leaving Group The resin (A) preferably has a repeating unit having a structure in which a phenolic hydroxyl group is protected with a leaving group as the repeating unit X1. Further, in the present specification, the phenolic hydroxyl group is a group formed by substituting a hydrogen atom of an aromatic hydrocarbon group is substituted with a hydroxyl group. The aromatic ring of the aromatic hydrocarbon group is a monocyclic or polycyclic aromatic ring, and examples thereof include a benzene ring and a naphthalene ring.

Examples of the leaving group include groups represented by Formulae (Y1) to (Y4).

—C(Rx₁)(Rx₂)(Rx₃)   Formula (Y1):

—C(=O)OC(Rx₁)(Rx₂)(Rx₃)   Formula (Y2):

—C(R₃₆)(R₃₇)(OR₃₈)   Formula (Y3):

—C(Rn)(H)(Ar)   Formula (Y4):

In Formulae (Y1) and (Y2), $Rx_1$ to $Rx_3$ each independently represent an (linear or branched) alkyl group or a (monocyclic or polycyclic) cycloalkyl group. Further, in a case where all of $Rx_1$ to $Rx_3$ are (linear or branched) alkyl groups, at least two of $Rx_1, \ldots,$ or $Rx_3$ are preferably methyl groups.

Above all, the repeating unit in which $Rx_1$ to $Rx_3$ each independently represent a linear or branched alkyl group is preferable, and the repeating unit in which $Rx_1$ to $Rx_3$ each independently represent a linear alkyl group is more preferable.

Two of $Rx_1$ to $Rx_3$ may be bonded to each other to form a monocycle or a polycycle.

As the alkyl group of each of $Rx_1$ to $Rx_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the cycloalkyl group formed by the bonding of two of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable. Among those, a monocyclic cycloalkyl group having 5 or 6 carbon atoms is more preferable.

In the cycloalkyl group formed by the bonding of two of $Rx_1$ to $Rx_3$, for example, one methylene group constituting the ring may be substituted with a heteroatom such as an oxygen atom or a group having a heteroatom, such as a carbonyl group.

With regard to the group represented by each of Formulae (Y1) and (Y2), for example, an aspect in which $Rx_1$ is a methyl group or an ethyl group, and $Rx_2$ and $Rx_3$ are bonded to each other to form the above-mentioned cycloalkyl group is preferable.

In Formula (Y3), $R_{36}$ and $R_{37}$ each independently represent a hydrogen atom or a monovalent organic group. $R_{38}$ represents a monovalent organic group. $R_{37}$ and $R_{38}$ may be bonded to each other to form a ring. Examples of the monovalent organic group include an alkyl group, a cycloalkyl group, an aryl group, an aralkyl group, and an alkenyl group. $R_{36}$ is preferably the hydrogen atom.

In Formula (Y4), Ar represents an aromatic hydrocarbon group. Rn represents an alkyl group, a cycloalkyl group, or an aryl group. Rn and Ar may be bonded to each other to form a non-aromatic ring. Ar is more preferably an aryl group.

The repeating unit having a structure (acid-decomposable group) in which a phenolic hydroxyl group is protected with a leaving group preferably has a structure in which a hydrogen atom in the phenolic hydroxyl group is protected with a group represented by each of Formulae (Y1) to (Y4).

As the repeating unit having a structure (acid-decomposable group) in which a phenolic hydroxyl group is protected with a leaving group, a repeating unit represented by General Formula (AII) is preferable.

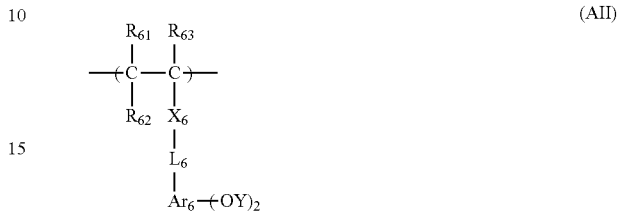

(AII)

In General Formula (AII), $R_{61}$, $R_{67}$, and $R_{63}$ each independently represent a hydrogen atom, an alkyl group, a cycloalkyl group, a halogen atom, a cyano group, or an alkoxycarbonyl group. It should be noted that $R_{62}$ may be bonded to $Ar_6$ to form a ring, and in this case, $R_{62}$ represents a single bond or an alkylene group.

$X_6$ represents a single bond, —COO—, or —CONR₆₄—. $R_{64}$ represents a hydrogen atom or an alkyl group.

$L_6$ represents a single bond or an alkylene group.

$Ar_6$ represents an (n+1)-valent aromatic hydrocarbon group, and in a case where $Ar_6$ is bonded to $R_{62}$ to form a ring, $Ar_6$ represents an (n+2)-valent aromatic hydrocarbon group.

In a case of n≥2, $Y_2$'s each independently represent a hydrogen atom or a group that leaves by the action of an acid. It should be noted that at least one of $Y_2$'s represents the group that leaves by the action of an acid. The group that leaves by the action of an acid as $Y_2$ is preferably a group represented by each of Formulae (Y1) to (Y4).

n represents an integer of 1 to 4.

Each of the groups may have a substituent, and examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), and the number of carbon atoms is preferably 8 or less.

Specific examples of the repeating unit represented by General Formula (AII) are set forth below, but the present invention is not limited thereto.

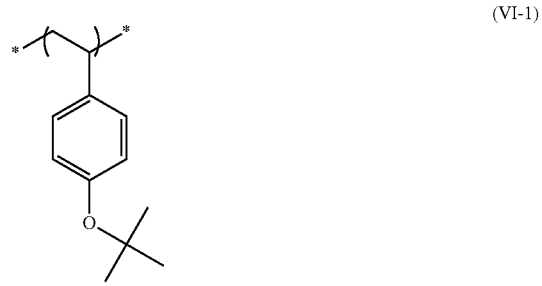

(VI-1)

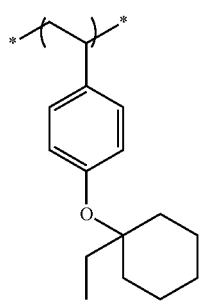
(VI-2)
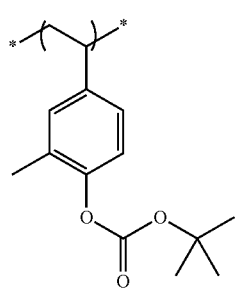
(VI-3)
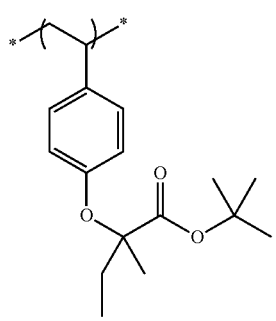
(VI-4)
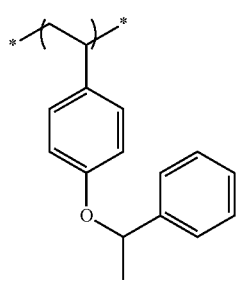
(VI-5)
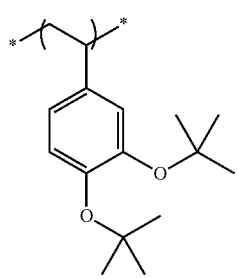
(VI-6)
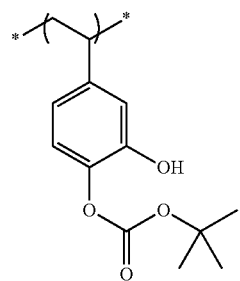
(VI-7)
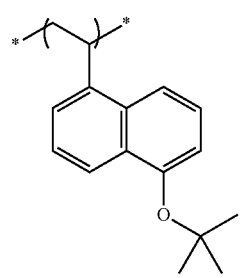
(VI-8)
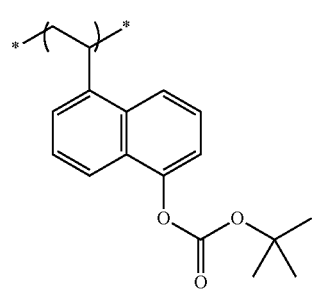
(VI-9)
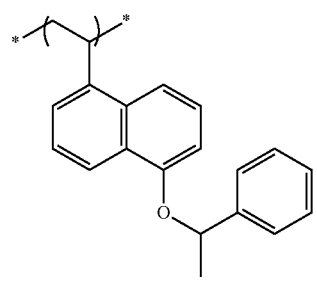
(VI-10)
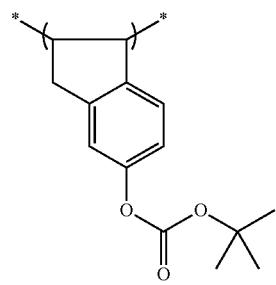
(VI-11)

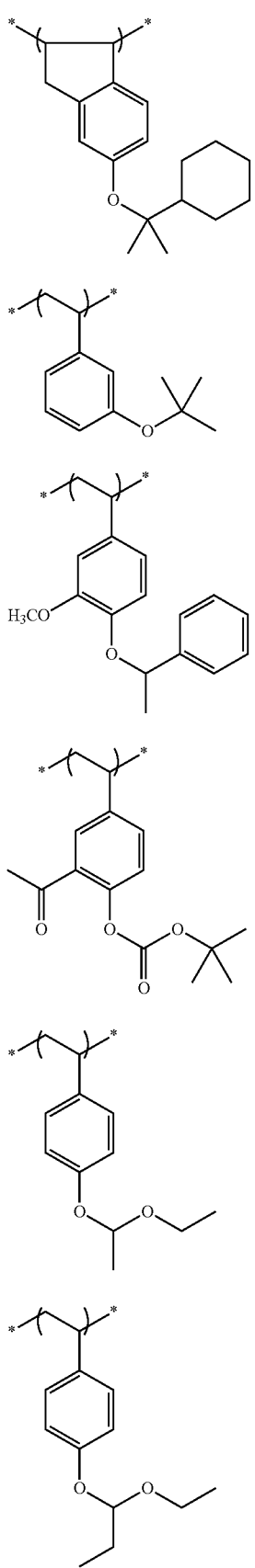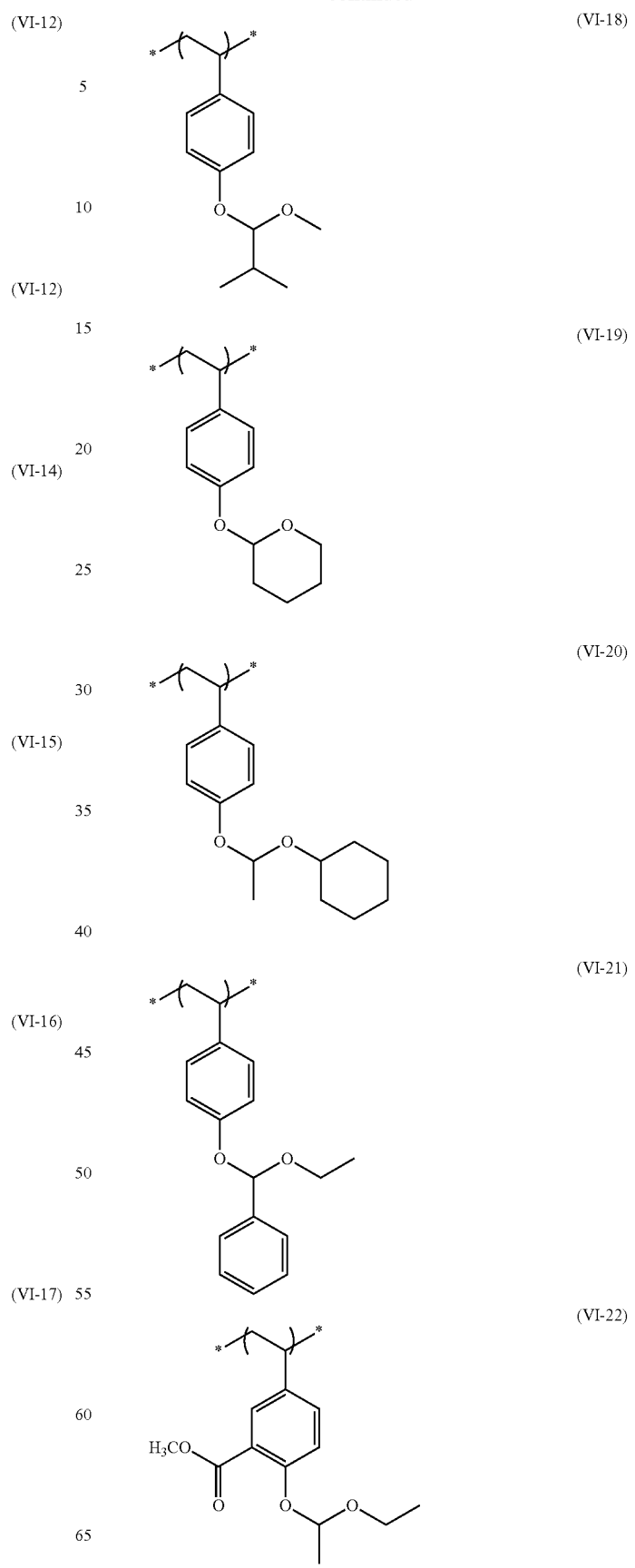

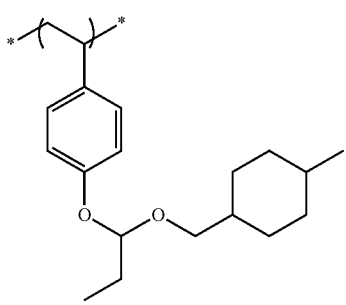 (VI-23)
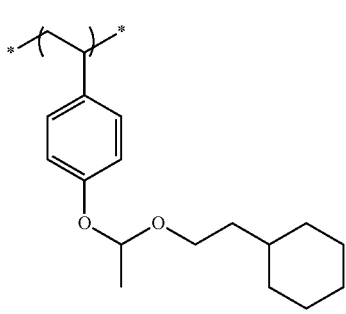 (VI-24)
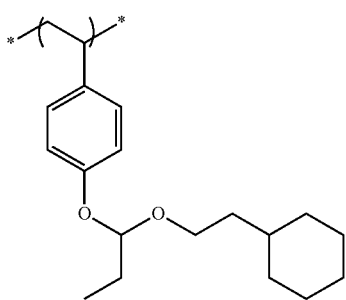 (VI-25)
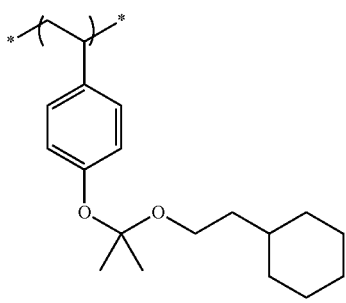 (VI-26)
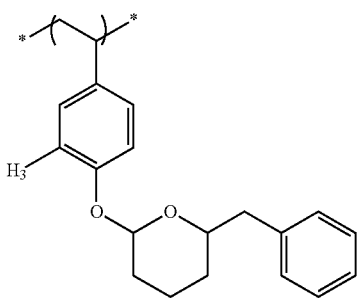 (VI-27)
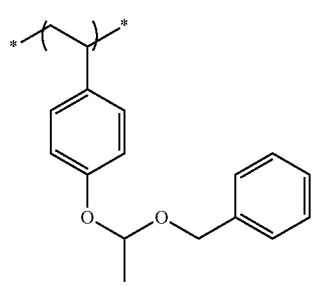 (VI-28)
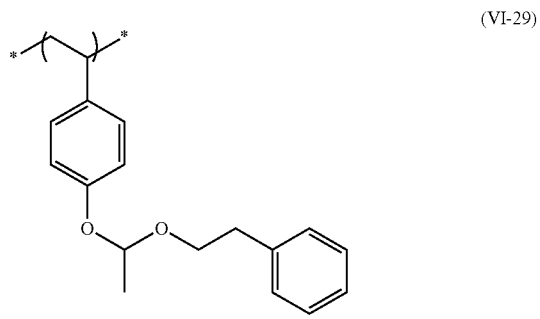 (VI-29)
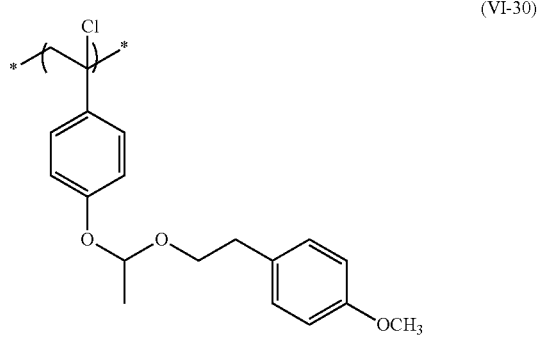 (VI-30)
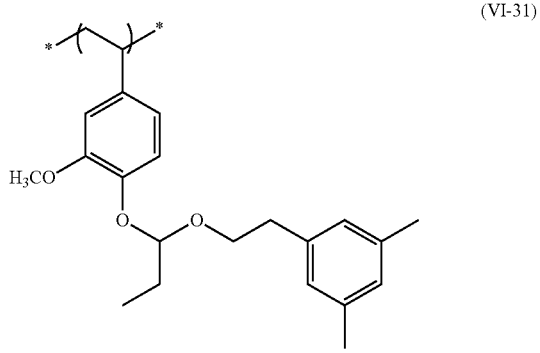 (VI-31)
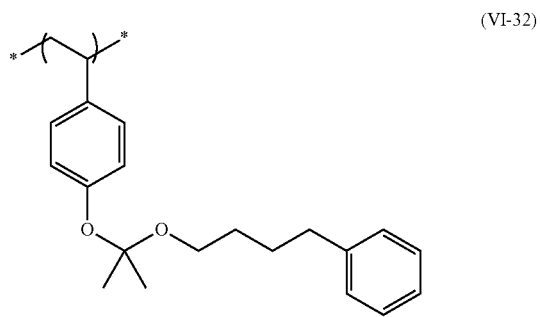 (VI-32)

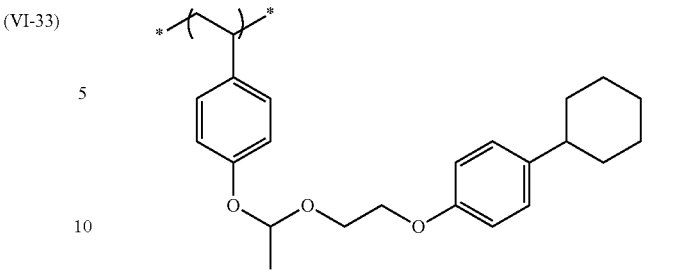
(VI-33)
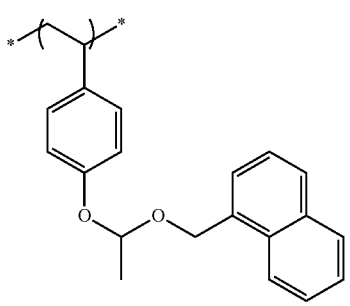
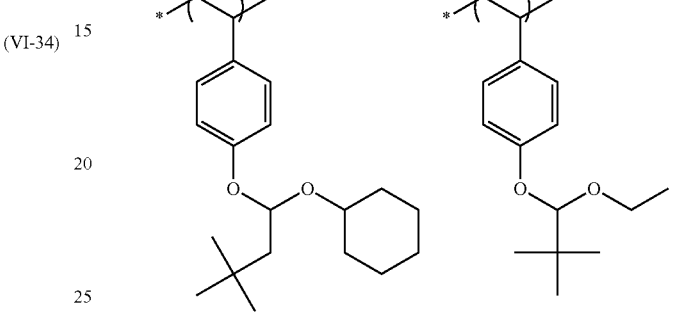
(VI-34)
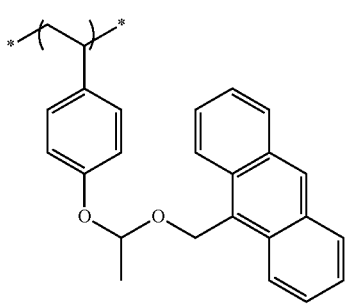
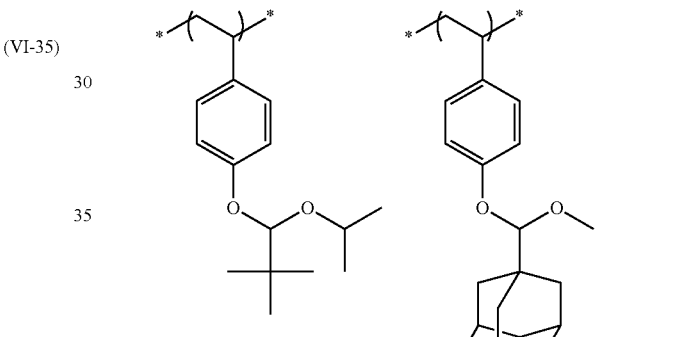
(VI-35)
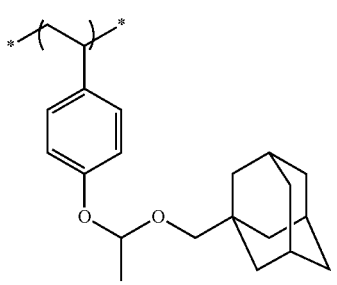
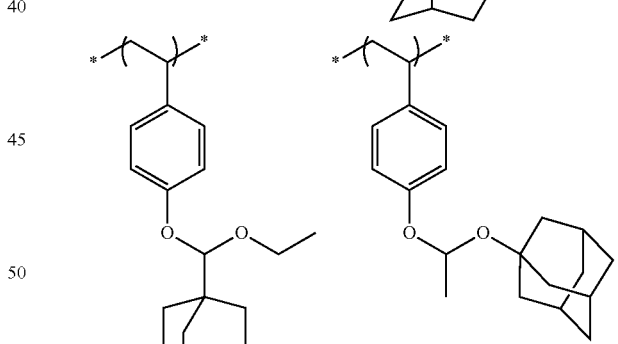
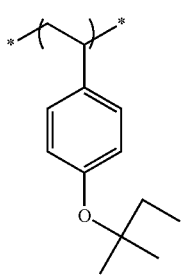
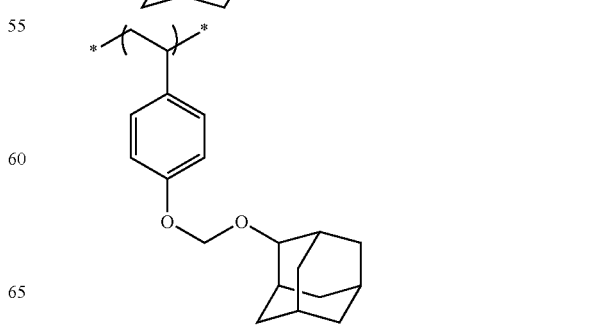
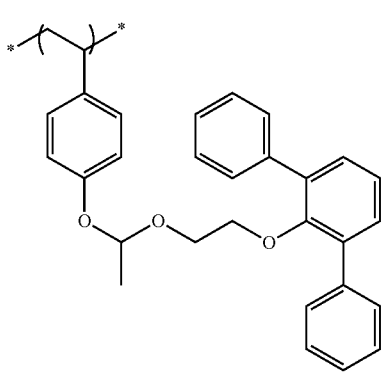

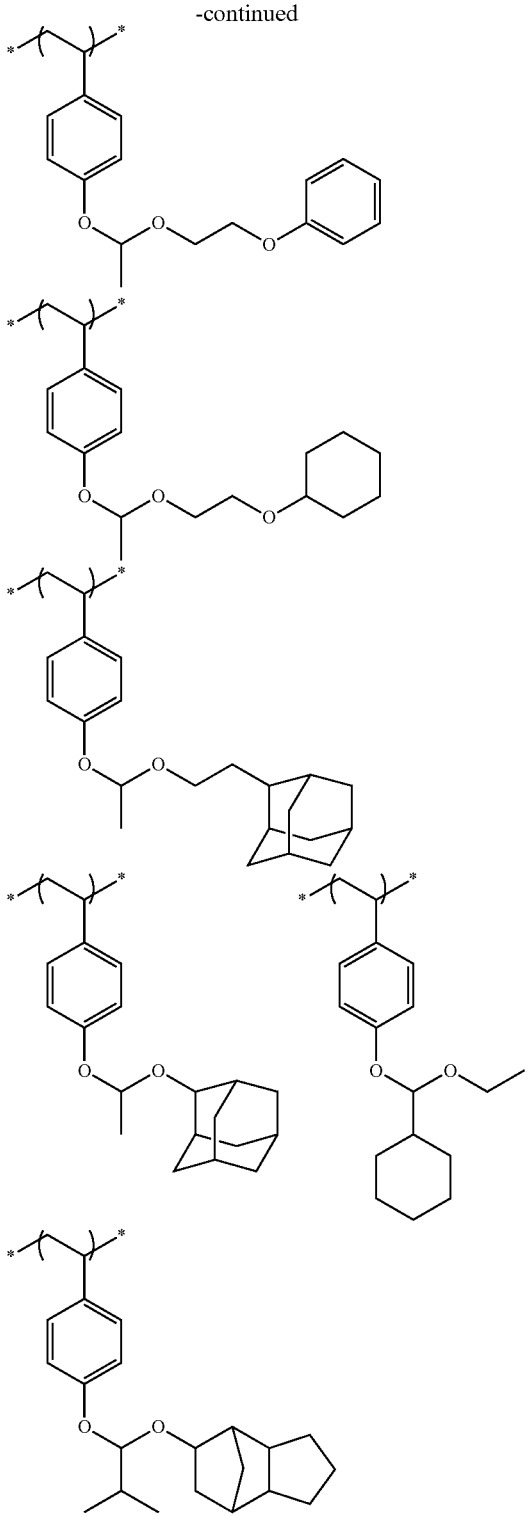

The resin (A) may use one kind or two or more kinds of the repeating units X1 in combination.

In the resin (A), the content of the repeating unit X1 (a total content in a case where the repeating units X1 are present in plural number) is preferably 5% by mole or more, more preferably 10% by mole or more, and still more preferably 20% by mole or more, with respect to all the repeating units of the resin (A). In addition, an upper limit value of the content of the repeating unit X1 is, for example, preferably 50% by mole or less, and more preferably 40% by mole or less, with respect to all the repeating units of the resin (A).

(Other Repeating Units)

The resin (A) may include other repeating units, in addition to the repeating unit X1.

Other repeating units that can be included in the resin (A) will be described below in detail.

Repeating Unit Having Phenolic Hydroxyl Group

The resin (A) preferably includes a repeating unit having a phenolic hydroxyl group (hereinafter also referred to as a "repeating unit X2"), in addition to the above-mentioned repeating unit X1. In addition, the repeating unit X2 does not have an acid-decomposable group. By incorporation of the repeating unit X2 into the resin (A), the resin (A) has an excellent dissolution rate upon alkali development.

Examples of the repeating unit X2 include a hydroxystyrene repeating unit or a hydroxystyrene (meth)acrylate repeating unit. As the repeating unit X2, among those, a repeating unit represented by General Formula (I) is preferable.

In the formula, $R_{41}$, $R_{42}$, and $R_{43}$ each independently represent a hydrogen atom, an alkyl group, a cycloalkyl group, a halogen atom, a cyano group, or an alkoxycarbonyl group. It should be noted that $R_{42}$ may be bonded to $Ar_4$ to form a ring, and in this case, $R_{42}$ represents a single bond or an alkylene group.

$X_4$ represents a single bond, —COO—, or —CONR$_{64}$—, and $R_{64}$ represents a hydrogen atom or an alkyl group.

$L_4$ represents a single bond or a divalent linking group.

$Ar_4$ represents an (n+1)-valent aromatic hydrocarbon group, and in a case where $Ar_4$ is bonded to $R_{42}$ to form a ring, $Ar_4$ represents an (n+2)-valent aromatic hydrocarbon group.

n represents an integer of 1 to 5.

For the purpose of increasing the polarity of the repeating unit represented by General Formula (I), it is preferable that n is an integer of 2 or more, or $X_4$ is —COO— or —CONR$_{64}$—.

As the alkyl group represented by each of $R_{41}$, $R_{42}$, and $R_{43}$ in General Formula (I), an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, each of which may have a substituent, is preferable, an alkyl group having 8 or less carbon atoms is more preferable, and an alkyl group having 3 or less carbon atoms is still more preferable.

The cycloalkyl group represented by each of $R_{41}$, $R_{42}$, and $R_{43}$ in General Formula (I) may be either a monocycle or a polycycle. Among those, a monocyclic cycloalkyl group having 3 to 8 carbon atoms, such as a cyclopropyl group, a cyclopentyl group, and a cyclohexyl group, which may have a substituent, is preferable.

Examples of the halogen atom represented by each of $R_{41}$, $R_{42}$, and $R_{43}$ in General Formula (I) include a fluorine atom, a chlorine atom, a bromine atom, and an iodine atom, and the fluorine atom is preferable.

As the alkyl group included in the alkoxycarbonyl group represented by each of $R_{41}$, $R_{42}$, and $R_{43}$ in General Formula (I), the same ones as the alkyl group in each of $R_{41}$, $R_{42}$, and $R_{43}$ are preferable.

Preferred examples of the substituent in each of the groups include an alkyl group, a cycloalkyl group, an aryl group, an amino group, an amido group, an ureido group, an urethane group, a hydroxyl group, a carboxyl group, a halogen atom, an alkoxy group, a thioether group, an acyl group, an acyloxy group, an alkoxycarbonyl group, a cyano group, and a nitro group, and the number of carbon atoms of the substituent is preferably 8 or less.

$Ar_4$ represents an (n+1)-valent aromatic hydrocarbon group. The divalent aromatic hydrocarbon group in a case where n is 1 may have a substituent, and for example, an arylene group having 6 to 18 carbon atoms, such as a phenylene group, a tolylene group, a naphthylene group, and an anthracenylene group, or an aromatic hydrocarbon group including a heterocycle such as thiophene, furan, pyrrole, benzothiophene, benzofuran, benzopyrrole, triazine, imidazole, benzimidazole, triazole, thiadiazole, and thiazole is preferable.

Specific examples of the (n+1)-valent aromatic hydrocarbon group in a case where n is an integer of 2 or more include groups formed by excluding any (n−1) hydrogen atoms from the above-mentioned specific examples of the divalent aromatic hydrocarbon group.

The (n+1)-valent aromatic hydrocarbon group may further have a substituent.

Examples of the substituent which can be contained in the above-mentioned alkyl group, cycloalkyl group, alkoxycarbonyl group, and (n+1)-valent aromatic hydrocarbon group include the alkyl groups listed in $R_{41}$, $R_{42}$, and $R_{43}$ in General Formula (1); alkoxy groups such as a methoxy group, an ethoxy group, a hydroxyethoxy group, a propoxy group, a hydroxypropoxy group, and a butoxy group; and aryl groups such as a phenyl group.

As the alkyl group of $R_{64}$ in —$CONR_{64}$— ($R_{64}$ represents a hydrogen atom or an alkyl group) represented by $X_4$, an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, is preferable, and an alkyl group having 8 or less carbon atoms is more preferable.

As $X_4$, a single bond, —COO—, or —CONH— is preferable, and the single bond or —COO— is more preferable.

As the divalent linking group as $L_4$, an alkylene group is preferable, and as the alkylene group, an alkylene group having 1 to 8 carbon atoms, such as a methylene group, an ethylene group, a propylene group, a butylene group, a hexylene group, and an octylene group, each of which may have a substituent, is preferable.

As $Ar_4$, an aromatic hydrocarbon group having 6 to 18 carbon atoms, which may have a substituent, is preferable, and a benzene ring group, a naphthalene ring group, or a biphenylene ring group is more preferable. Among those, the repeating unit represented by General Formula (I) is preferably a repeating unit derived from hydroxystyrene. That is, $Ar_4$ is preferably a benzene ring group.

Specific examples of the repeating unit X2 are set forth below, but the present invention is not limited thereto. In the formulae, a represents 1 or 2.

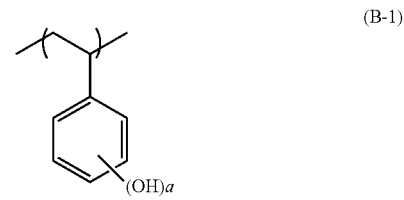

(B-1)

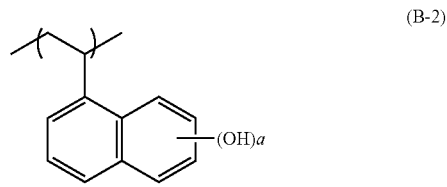

(B-2)

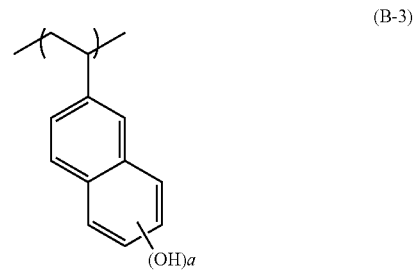

(B-3)

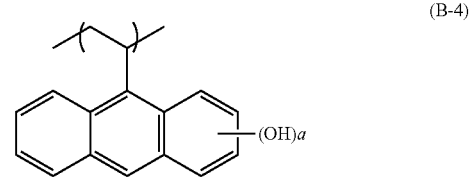

(B-4)

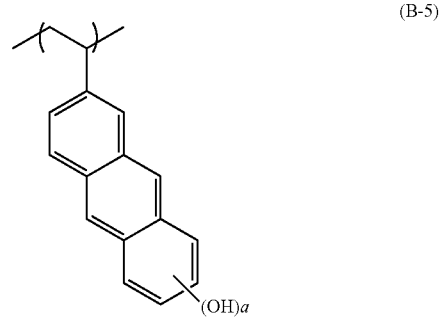

(B-5)

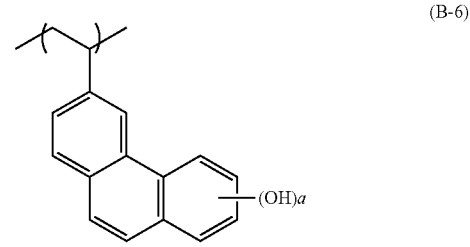

(B-6)

(B-7) 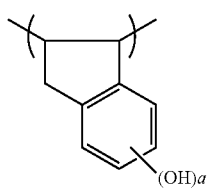
(B-8) 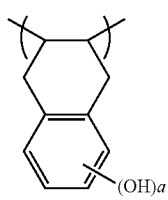
(B-9) 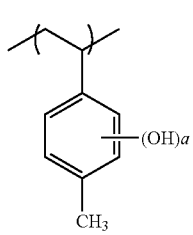
(B-10) 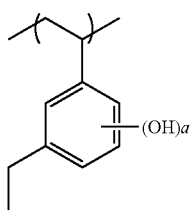
(B-11) 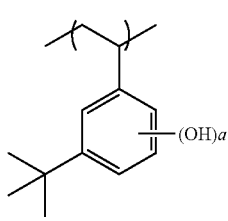
(B-12) 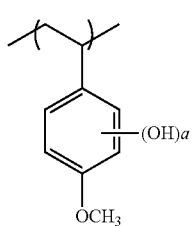
(B-13) 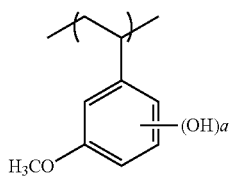
(B-14) 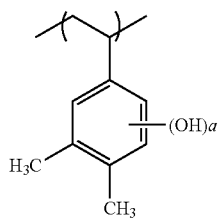
(B-15) 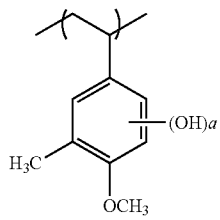
(B-16) 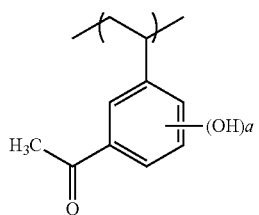
(B-17) 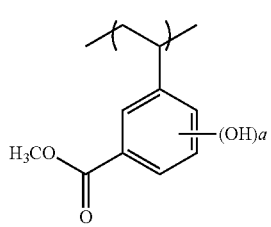
(B-18) 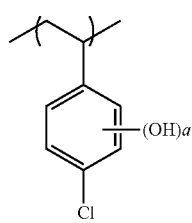
(B-19) 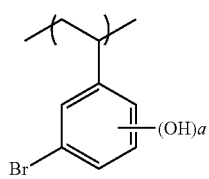
(B-20) 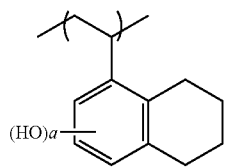

(B-21) 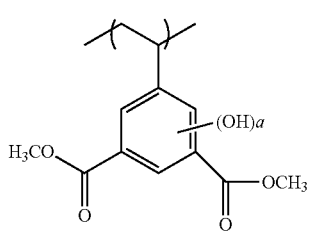

(B-22) 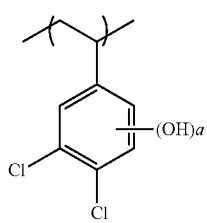

(B-23) 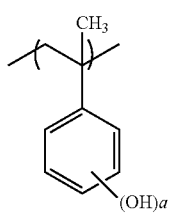

(B-24) 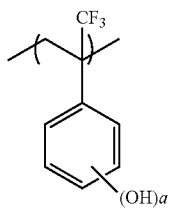

(B-25) 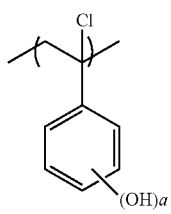

(B-26) 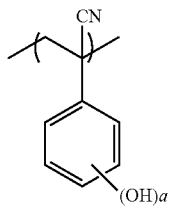

(B-27) 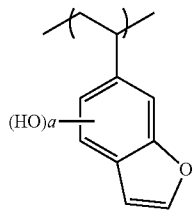

(B-28) 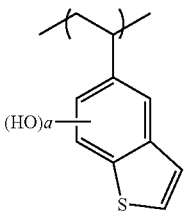

(B-29) 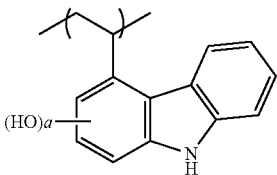

(B-30) 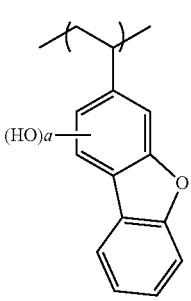

(B-31) 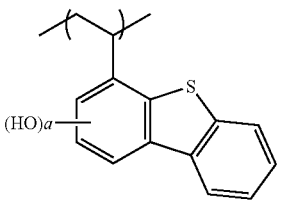

(B-32) 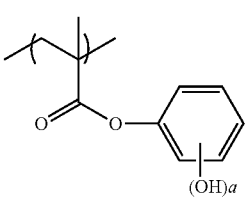

(B-33) 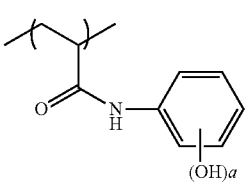

(B-34) 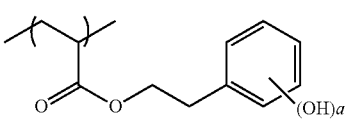

The resin (A) may use one kind or two or more kinds of the repeating units X2 in combination.

In the resin (A), the content of the repeating unit X2 (a total content in a case where the repeating units X2 are present in plural number) is preferably 40% by mole or more, more preferably 50% by mole or more, and still more preferably 60% by mole or more, and is also preferably 85% by mole or less, and more preferably 80% by mole or less, with respect to all the repeating units of the resin (A).

Repeating Unit Having Non-Acid-Decomposable Chained Alkyl Group Having 2 or More Carbon Atoms, which May Include Hetero Atom From the viewpoint that residual solvents can be more easily volatilized, it is preferable that the resin (A) includes a repeating unit having a non-acid-decomposable chained alkyl group having 2 or more carbon atoms, which may include a heteroatom (hereinafter also referred to as a "repeating unit X3"). Further, an expression of "being non-acid-decomposable" means having a property of not causing a leaving/decomposing reaction by an acid generated by a photoacid generator. That is, more specific examples of the "non-acid-decomposable chained alkyl group" include a chained alkyl group that does not leave from the resin (A) by the action of an acid generated by a photoacid generator, and a chained alkyl group that does not decompose by the action of an acid generated by a photoacid generator.

As the repeating unit X3, a repeating unit derived from a monomer having a glass transition temperature (Tg (° C.)) of 50° C. or lower (preferably 30° C. or lower) in a case where a homopolymer is formed is preferable. In addition, the lower limit value is not particularly limited, but is −80° C. or higher in many cases.

Hereinbelow, the repeating unit X3 will be described. Further, as the glass transition temperature, in a case where there is a catalog value or a literature value, the value is employed, and in a case where there is not such a value, the glass transition temperature can be measured by a differential scanning calorimetry (DSC) method.

The non-acid-decomposable chained alkyl group having 2 or more carbon atoms, which may include a heteroatom, is not particularly limited, but examples thereof include a chained (either linear or branched) alkyl group having 2 to 20 carbon atoms and a chained alkyl group having 2 to 20 carbon atoms, which contains a heteroatom.

Examples of the chained alkyl group having 2 to 20 carbon atoms, which contains a heteroatom, include a chained alkyl group, in which one or two or more of —CH$_2$-'s are substituted with —O—, —S—, —CO—, —NR$_6$—, or a divalent organic group formed by combination of two or more of these groups. R$_6$ represents a hydrogen atom or an alkyl group having 1 to 6 carbon atoms.

Specific examples of the non-acid-decomposable chained alkyl group having 2 or more carbon atoms, which may include a heteroatom, include a methyl group, an ethyl group, a propyl group, a butyl group, a pentyl group, a hexyl group, a heptyl group, an octyl group, a nonyl group, a decyl group, an isobutyl group, a sec-butyl group, a 1-ethylpentyl group, a 2-ethylhexyl group, and a monovalent alkyl group in which one or two or more of —CH$_2$-'s of the alkyl group are substituted with —O— or —O—CO—.

From the viewpoint that the film density of a pattern thus formed is more excellent, the number of carbon atoms of the non-acid-decomposable chained alkyl group having 2 or more carbon atoms, which may include a heteroatom, is preferably 2 to 10, and more preferably 2 to 8.

Furthermore, the non-acid-decomposable chained alkyl group having 2 or more carbon atoms may have a substituent (for example, substituents exemplified as a substituent T).

From the viewpoint that the film density of a pattern thus formed is more excellent, among those, a repeating unit represented by General Formula (1) is preferable as the repeating unit X3.

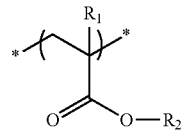

General Formula (1)

In General Formula (1), R$_1$ represents a hydrogen atom, a halogen atom, or an alkyl group. R$_2$ represents a non-acid-decomposable chained alkyl group having 2 or more carbon atoms, which may include a heteroatom.

The halogen atom represented by R$_1$ is not particularly limited, but examples thereof include a fluorine atom, a chlorine atom, a bromine atom, and an iodine atom.

The alkyl group (which may be in any one of linear, branched, and cyclic forms) represented by R$_1$ is not particularly limited, but examples thereof include an alkyl group having 1 to 10 carbon atoms, and specifically a methyl group, an ethyl group, and a tert-butyl group. Among those, an alkyl group having 1 to 3 carbon atoms is preferable, and the methyl group is more preferable.

Among those, as R$_1$, the hydrogen atom or the methyl group is preferable.

The definition and suitable aspects of the non-acid-decomposable chained alkyl group having 2 or more carbon atoms, which may include a heteroatom, represented by R$_2$, are as described above.

Examples of a monomer constituting the repeating unit X3 include ethyl acrylate (−22° C.), n-propyl acrylate (−37° C.), isopropyl acrylate (−5° C.), n-butyl acrylate (−55° C.), n-butyl methacrylate (20° C.), n-hexyl acrylate (−57° C.), 2-ethylhexyl acrylate (−70° C.), isononyl acrylate (−82° C.), lauryl methacrylate (−65° C.), 2-hydroxyethyl acrylate (−15° C.), 2-hydroxypropyl methacrylate (26° C.), 1-[2-(methacryloyloxy)ethyl] succinate (9° C.), 2-ethylhexyl methacrylate (−10° C.), sec-butyl acrylate (−26° C.), methoxypolyethylene glycol monomethacrylate (n=2) (−20° C.), hexadecyl acrylate (35° C.), and 2-ethylhexyl methacrylate (−10° C.). Further, Tg (° C.) in a case where the monomer is formed into a homopolymer is shown in the parenthesis.

The resin (A) may use one kind or two or more kinds of the repeating units X3 in combination.

In the resin (A), the content of the repeating unit X3 (a total content in a case where the repeating units X3 are present in plural number) is preferably 5% by mole or more, more preferably 5% to 30% by mole, and still more preferably 5% to 20% by mole, with respect to all the repeating units in the resin (A).

Repeating Unit Having at Least One Selected from Group Consisting of Lactone Structure, Sultone Structure, and Carbonate Structure The resin (A) preferably includes a repeating unit having at least one selected from the group consisting of a lactone structure, a sultone structure, and a carbonate structure (hereinafter also referred to as a "repeating unit X4").

As the lactone structure or sultone structure, any structure may be used as long as it has a lactone structure or sultone structure, but a 5- to 7-membered ring lactone structure or a 5- to 7-membered ring sultone structure is preferable. Among those, a 5- to 7-membered ring lactone structure to which another ring structure is fused in the form of forming a bicyclo structure or a spiro structure or a 5- to 7-membered ring sultone structure to which another ring structure is fused in the form of forming a bicyclo structure or a spiro structure is more preferable.

The resin (A) still more preferably includes a repeating unit having a lactone structure represented by any one of General Formulae (LC1-1) to (LC1-21) or a sultone structure represented by any one of General Formulae (SL1-1) to (SL1-3). Further, the lactone structure or sultone structure may be bonded directly to the main chain. Preferred examples of the structure include a lactone structure represented by General Formula (LC1-1), General Formula (LC1-4), General Formula (LC1-5), General Formula (LC1-8), General Formula (LC1-16), or General Formula (LC1-21), or a sultone structure represented by General Formula (SL1-1).

LC1-1
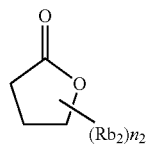

LC1-2
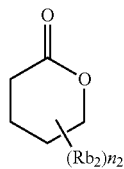

LC1-3
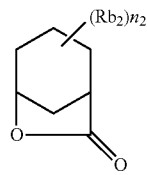

LC1-4
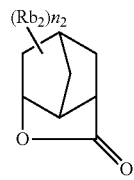

LC1-5
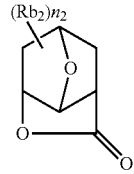

LC1-6
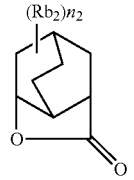

-continued

LC1-7
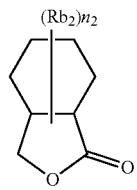

LC1-8
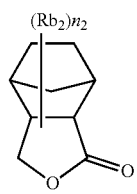

LC1-9
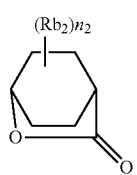

LC1-10
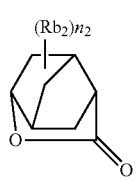

LC1-11
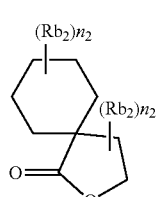

LC1-12
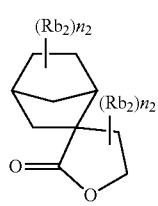

LC1-13
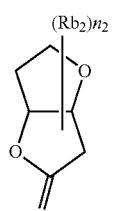

LC1-14
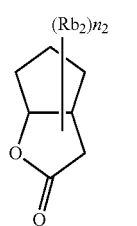

LC1-15
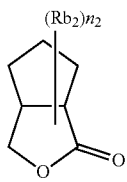

LC1-16
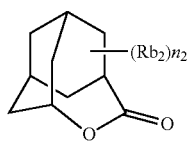

LC1-17
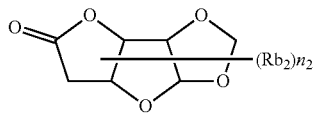

LC1-18
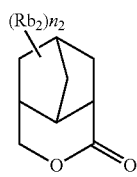

LC1-19
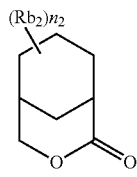

LC1-20
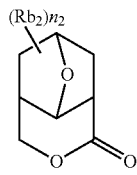

LC1-21
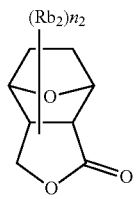

SL1-1
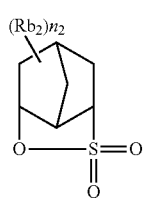

SL1-2
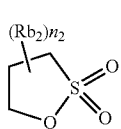

SL1-3
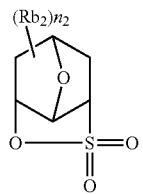

The lactone structural moiety or the sultone structural moiety may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group, and an alkyl group having 1 to 4 carbon atoms, the cyano group, or the acid-decomposable group is more preferable. $n_2$ represents an integer of 0 to 4. In a case where $n_2$ is 2 or more, the substituents ($Rb_2$) which are present in plural number may be the same as or different from each other. Further, the substituents ($Rb_2$) which are present in plural number may be bonded to each other to form a ring.

As the repeating unit having a lactone structure or sultone structure, a repeating unit represented by General Formula (III) is preferable.

(III)

In General Formula (III),

A represents an ester bond (a group represented by —COO—) or an amide bond (a group represented by —CONH—).

n is the repetition number of the structure represented by —$R_0$—Z—, represents an integer of 0 to 5, and is preferably 0 or 1, and more preferably C0. In a case where n is 0, —$R_0$—Z— is not present, and is thus a single bond.

$R_0$ represents an alkylene group, a cycloalkylene group, or a combination thereof. In a case where $R_0$'s are present in plural number, $R_0$'s each independently represent an alkylene group, a cycloalkylene group, or a combination thereof.

Z represents a single bond, an ether bond, an ester bond, an amide bond, a urethane bond, or a urea bond. In a case where Z's are present in plural number, is each independently represent a single bond, an ether bond, an ester bond, an amide bond, or a urethane bond.

$R_8$ represents a monovalent organic group having a lactone structure or sultone structure.

$R_7$ represents a hydrogen atom, a halogen atom, or a monovalent organic group (preferably a methyl group).

The alkylene group or the cycloalkylene group of $R_0$ may have a substituent.

As Z, an ether bond or an ester bond is preferable, and the ester bond is more preferable.

The resin (A) may have a repeating unit having a carbonate structure. The carbonate structure is preferably a cyclic carbonate ester structure.

The repeating unit having a cyclic carbonate ester structure is preferably a repeating unit represented by General Formula (A-1).

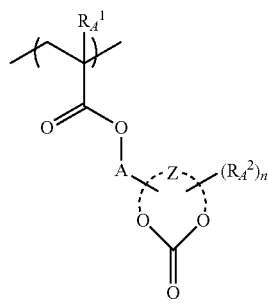

(A-1)

In General Formula (A-1), $R_A^1$ represents a hydrogen atom, a halogen atom, or a monovalent organic group (preferably a methyl group).

n represents an integer of 0 or more.

$R_A^2$ represents a substituent. In a case where n is 2 or more, $R_A^2$'s each independently represent a substituent.

A represents a single bond or a divalent linking group.

Z represents an atomic group which forms a monocyclic or polycyclic structure together with a group represented by —O—C(=O)—O— in the formula.

It is also preferable that the resin (A) has the repeating unit described in paragraphs <0370> to <0414> of US2016/0070167A1 as the repeating unit X4.

The resin (A) may have only one kind or a combination of two or more kinds of the repeating units X4.

Specific examples of a monomer corresponding to the repeating unit represented by General Formula (III) and a monomer corresponding to the repeating unit represented by General Formula (A-1) are set forth below, but the present invention is not limited to these specific examples. The following specific examples correspond to a case where $R_7$ in General Formula (III) and $R_A^1$ in General Formula (A-1) are each a methyl group, but $R_7$ and $R_A^1$ may be optionally substituted with a hydrogen atom, a halogen atom, or a monovalent organic group.

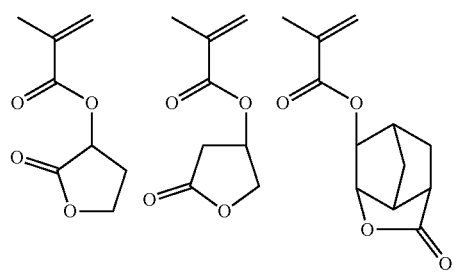

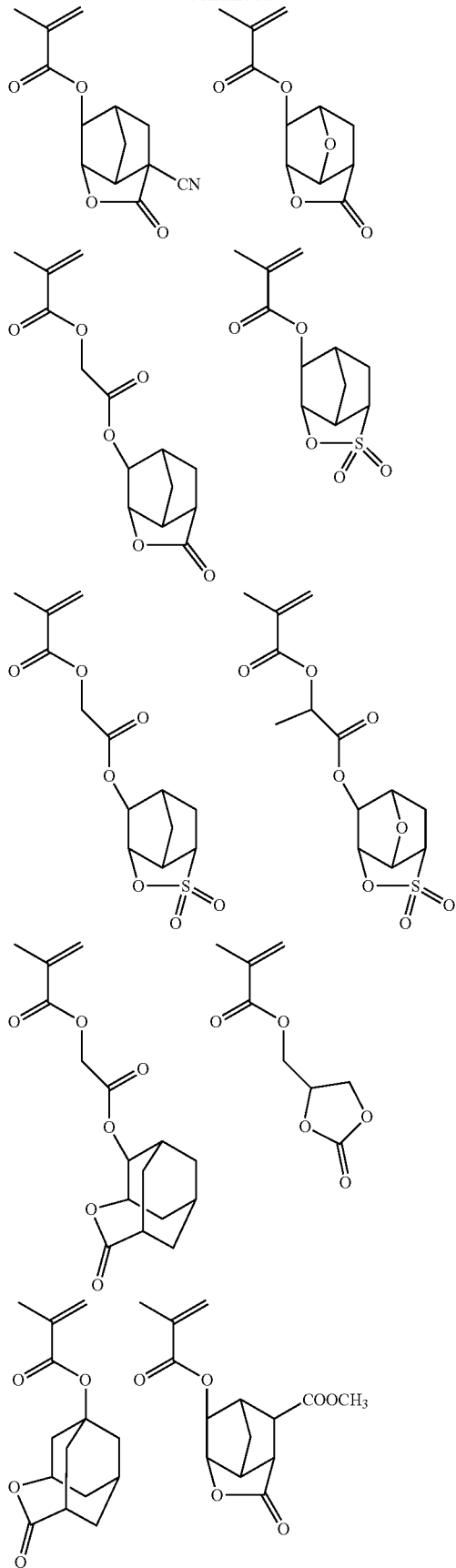

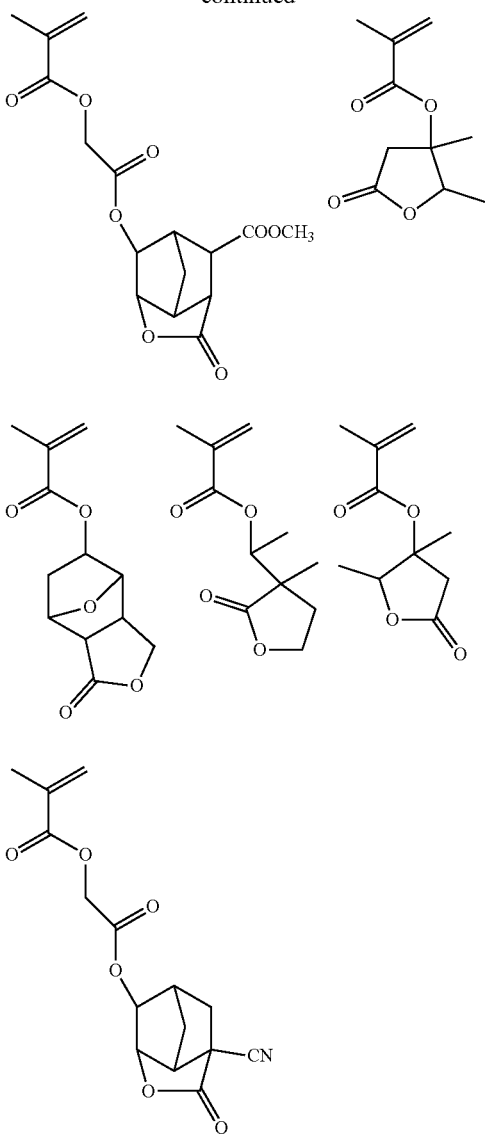

In addition to the monomers, monomers set forth below are also suitably used as a raw material of the resin (A).

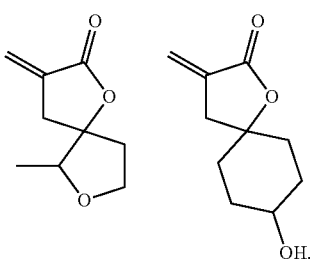

The content of the repeating units X4 included in the resin (A) (a total content in a case where the repeating units X4 are present in plural number) is preferably 5% to 30% by mole, more preferably 10% to 30% by mole, and still more preferably 20% to 30% by mole, with respect to all the repeating units in the resin (A).

Repeating Unit Having Aromatic Ring

The resin (A) preferably includes a repeating unit having an aromatic ring (hereinafter also referred to as a "repeating unit X5"), in addition to the repeating unit X1 and the repeating unit X2.

As the repeating unit X5, for example, a repeating unit represented by General Formula (III) is preferable.

(III)

In the repeating unit represented by General Formula (III), $R_{41}$, $R_{42}$, $R_{43}$, $X_4$, $L_4$, and $Ar_4$ each have the same definitions as $R_{41}$, $R_{42}$, $R_{43}$, $X_4$, $L_4$, and $Ar_4$, respectively, in the repeating unit represented by General Formula (I) exemplified in the repeating unit X2, and suitable aspects thereof are also the same.

Specific examples of the raw material monomer of the repeating unit represented by General Formula (III) include benzyl (meth)acrylate and styrene.

The resin (A) may have only one kind or a combination of two or more kinds of the repeating units X5.

The content of the repeating unit X5 (a total content in a case where the repeating units X5 are present in plural number) in the resin (A) is preferably 5% by mole or more, more preferably 5% to 30% by mole, and still more preferably 5% to 20% by mole, with respect to all the repeating units in the resin (A).

The resin (A) may include a variety of repeating structural units, in addition to the repeating structural units, for the purpose of controlling dry etching resistance, suitability for a standard developer, adhesiveness to a substrate, and a resist profile, or resolving power, heat resistance, sensitivity, and the like which are general characteristics required for a resist.

Examples of such a repeating structural unit include, but are not limited to, repeating structural units corresponding to a predetermined monomer.

Examples of such a predetermined monomer include a compound having one addition-polymerizable unsaturated bond, which is selected from acrylic acid esters, methacrylic acid esters, acrylamides, methacrylamides, allyl compounds, vinyl ethers, vinyl esters, and the like.

In addition to these, an addition-polymerizable unsaturated compound that is copolymerizable with the monomers corresponding to various repeating structural units as described above may be used.

In the resin (A), the molar ratio of each repeating structural unit contained is appropriately set in order to control various types of performance.

The weight-average molecular weight of the resin (A) is preferably 5,000 to 30,000, more preferably 10,000 to 25,000, and still more preferably 13,000 to 20,000. The dispersity (Mw/Mn) is usually 1.1 to 2.2, preferably 1.1 to 2.0, still more preferably 1.1 to 1.7, and even still more preferably 1.1 to 1.4.

The resin (A) may be used singly or in combination of two or more kinds thereof.

The content of the resin (A) in the composition of the embodiment of the present invention is generally 20% by mass or more in many cases and is preferably 40% by mass or more, more preferably 60% by mass or more, and still more preferably 80% by mass or more, with respect to a total solid content of the composition. An upper limit thereof is not particularly limited, but is preferably 99.5% by mass or less, more preferably 99% by mass or less, and still more preferably 98% by mass or less.

<Specific Additive (B)>

The composition of the embodiment of the present invention includes a specific additive (hereinafter also referred to as a "specific additive (B)").

The specific additive (B) has a melting point or glass transition temperature of lower than 25° C. and a molecular weight of 180 or more. In addition, the specific additive (B) only needs to have at least one of the melting point or the glass transition temperature of lower than 25° C. By allowing the specific additive (B) to have the predetermined characteristics, the plasticity of a resist film thus formed is improved, and as a result, the solvent in the film is more likely to be volatilized upon baking before exposure (pre-baking (PB)).

The melting point and the glass transition temperature (Tg (° C.)) of the specific additive (B) are each preferably 25° C. or lower, and more preferably 0° C. or lower, from the viewpoint that the film density of a pattern thus formed is more excellent. In addition, a lower limit value thereof is, for example, −100° C. or higher. In addition, as the melting point and the glass transition temperature, in a case where there is a catalog value or a literature value, the value is employed, and in a case where there is not such a value, the glass transition temperature can be measured by a differential scanning calorimetry (DSC) method.

Moreover, from the viewpoint that the film density of a pattern thus formed is more excellent, the molecular weight of the specific additive (B) is preferably 200 or more. In addition, an upper limit value thereof is, for example, 400 or less. In addition, in a case where the specific additive (B) has a molecular weight distribution, the weight-average molecular weight thereof is preferably 200 or more from the viewpoint that the film density of a pattern thus formed is more excellent. In addition, an upper limit value thereof is, for example, 400 or less.

The specific additive (B) is not particularly limited as long as it satisfies the condition, but from the viewpoint that it is easily dissolved in an alkali developer upon development, it is preferable that the specific additive (B) is water-soluble. In addition, an expression of being water-soluble is intended to mean that a solubility (25° C.) in water is 300 g/L or more.

In a case where the specific additive (B) is water-soluble, it hardly remains in the pattern from the viewpoint of easy dissolution in a developer upon development, and as a result, the film density of a pattern thus formed is more excellent.

Moreover, among those, the specific additives having a reactive group which can react with a polar group in the resin are preferable as the specific additive (B).

The reactive group is not particularly limited, but examples thereof include a hydroxyl group, a carboxyl group, and an amino group. By allowing the specific additive (B) to have the reactive group, the specific additive (B) is bonded to the resin by the reactive group and introduced into a film after exposing and developing the resist film, and therefore, the film density of a pattern thus formed is more excellent.

Examples of the specific additive (B) include a compound having a poly(oxyalkylene) structure.

In the compound having a poly(oxyalkylene) structure, the number of carbon atoms in the oxyalkylene unit is preferably 2 to 6, and more preferably 2 to 3. In addition, the average number of the oxyalkylene units added is preferably 2 to 10, and more preferably 2 to 6.

Specific examples of the specific additive (B) include the following ones.

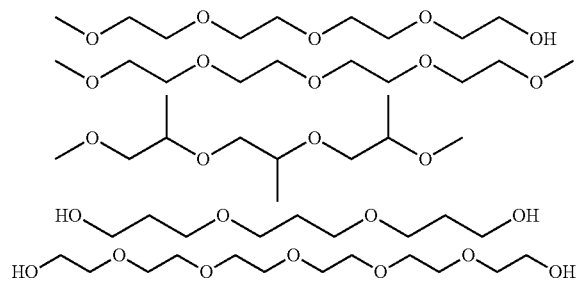

The specific additive (B) may be used singly or in combination of two or more kinds thereof.

The content of the specific additive (B) in the composition of the embodiment of the present invention is 1% by mass or more, preferably 3% by mass or more, and more preferably 5% by mass or more, with respect to a total solid content of the composition. In addition, an upper limit thereof is, for example, 30% by mass or less, and preferably 25% by mass or less.

<Photoacid Generator (C)>

The composition of the embodiment of the present invention includes a photoacid generator (hereinafter also referred to as a "photoacid generator (C)").

The photoacid generator is a compound that generates an acid upon irradiation with actinic rays or radiation.

As the photoacid generator, a compound that generates an organic acid upon irradiation with actinic rays or radiation is preferable. Examples thereof include a sulfonium salt compound, an iodonium salt compound, a diazonium salt compound, a phosphonium salt compound, an imidesulfonate compound, an oximesulfonate compound, a diazodisulfone compound, a disulfone compound, and an o-nitrobenzylsulfonate compound.

As the photoacid generator, known compounds that generate an acid upon irradiation with actinic rays or radiation can be appropriately selected and used singly or as a mixture thereof. For example, the known compounds disclosed in paragraphs <0125> to <0319> of US2016/0070167A1, paragraphs <0086> to <0094> of US2015/000454-4A1, and paragraphs <0323> to <0402> of US2016/0237190A1 can be suitably used as the photoacid generator (C).

As the photoacid generator (C), for example, a compound represented by General Formula (ZI), General Formula (ZII), or General Formula (ZIII) is preferable.

In General Formula (ZI), $R_{201}$, $R_{202}$, and $R_{203}$ each independently represent an organic group.

The number of carbon atoms of the organic group as each of $R_{201}$, $R_{202}$, and $R_{203}$ is generally 1 to 30, and preferably 1 to 20.

In addition, two of $R_{201}$ to $R_{203}$ may be bonded to each other to form a ring structure, and the ring may include an oxygen atom, a sulfur atom, an ester bond, an amide bond, or a carbonyl group. Examples of the group formed by the bonding of two of $R_{201}$ to $R_{203}$ include an alkylene group (for example, a butylene group and a pentylene group) and —$CH_2$—$CH_2$—O—$CH_2$—$CH_2$—.

$Z^-$ represents an anion.

Suitable aspects of the cation in General Formula (ZI) include groups corresponding to a compound (ZI-1), a compound (ZI-2), a compound (ZI-3), and a compound (ZI-4).

Incidentally, the photoacid generator (C) may be a compound having a plurality of the structures represented by General Formula (ZI). For example, it may be a compound having a structure in which at least one of $R_{201}$, ..., or $R_{203}$ in the compound represented by General Formula (ZI) is bonded to at least one of $R_{201}$, ..., or $R_{203}$ of another compound represented by General Formula (ZI) through a single bond or a linking group.

First, the compound (ZI-1) will be described.

The compound (ZI-1) is an arylsulfonium compound in which at least one of $R_{201}$, ..., or $R_{203}$ in General Formula (ZI) is an aryl group, that is, a compound having arylsulfonium as a cation.

In the arylsulfonium compound, all of $R_{201}$ to $R_{203}$ may be aryl groups, or some of $R_{201}$ to $R_{203}$ may be aryl groups and the remainders may be alkyl groups or cycloalkyl groups, but all of $R_{201}$ to $R_{203}$ may be aryl groups.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

The aryl group included in the arylsulfonium compound is preferably a phenyl group or a naphthyl group, and more preferably the phenyl group. The aryl group may be an aryl group having a heterocyclic structure having an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium compound has two or more aryl groups, these two or more aryl groups may be the same as or different from each other.

The alkyl group or the cycloalkyl group which may be contained in the arylsulfonium compound, as desired, is preferably a linear alkyl group having 1 to 15 carbon atoms, a branched alkyl group having 3 to 15 carbon atoms, or a cycloalkyl group having 3 to 15 carbon atoms, and examples thereof include a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group of each of $R_{201}$ to $R_{203}$ may have an alkyl group (for example, an alkyl group having 1 to 15 carbon atoms), a cycloalkyl group (for example, a cycloalkyl group having 3 to 15 carbon atoms), an aryl group (for example, an aryl group having 6 to 14 carbon atoms), an alkoxy group (for example, an alkoxy group having 1 to 15 carbon atoms), a halogen atom, a hydroxyl group, or a phenylthio group as a substituent.

Next, the compound (ZI-2) will be described.

The compound (ZI-2) is a compound in which $R_{201}$ to $R_{203}$ in Formula (ZI) each independently represent an organic group having no aromatic ring. Here, the aromatic ring also encompasses an aromatic ring containing a heteroatom.

The number of carbon atoms of the organic group, as each of $R_{201}$ to $R_{203}$, which has no aromatic ring, is generally 1 to 30, and preferably 1 to 20.

$R_{201}$ to $R_{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and particularly preferably a linear or branched 2-oxoalkyl group.

As the alkyl group and the cycloalkyl group of each of $R_{201}$ to $R_{203}$, a linear alkyl group having 1 to 10 carbon atoms or a branched alkyl group having 3 to 10 carbon atoms (for example, a methyl group, an ethyl group, a propyl group, a butyl group, and a pentyl group), or a cycloalkyl group having 3 to 10 carbon atoms (a cyclopentyl group, a cyclohexyl group, and a norbornyl group) is preferable.

$R_{201}$ to $R_{203}$ may further be substituted with a halogen atom, an alkoxy group (for example, an alkoxy group having 1 to 5 carbon atoms), a hydroxyl group, a cyano group, or a nitro group.

Next, the compound (ZI-3) will be described.

The compound (ZI-3) is a compound represented by General Formula (ZI-3), which has a phenacylsulfonium salt structure.

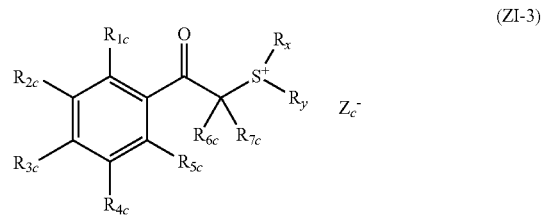

(ZI-3)

In General Formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

$R_x$ and $R_y$ each independently represent a hydrogen atom, an alkyl group, a cycloalkyl group, a halogen atom, a cyano group, or an aryl group.

$R_x$ and $R_y$ each independently represent an alkyl group, a cycloalkyl group, a 2-oxoalkyl group, a 2-oxocycloalkyl group, an alkoxycarbonylalkyl group, an allyl group, or a vinyl group.

Any two or more of $R_{1c}$, ..., or $R_{5c}$, $R_{5c}$ and $R_{6c}$, $R_{6c}$ and $R_{7e}$, $R_{5c}$ and $R_x$, or $R_x$, and $R_y$ may be bonded to each other to form a ring structure, and the ring structure may each independently include an oxygen atom, a sulfur atom, a ketone group, an ester bond, or an amide bond.

Examples of the ring structure include an aromatic or non-aromatic hydrocarbon ring, an aromatic or non-aromatic heterocycle, or a polycyclic fused ring formed of two or more of these rings. Examples of the ring structure include 3- to 10-membered rings, and the ring structures are preferably 4- to 8-membered ring, and more preferably 5- or 6-membered rings.

Examples of groups formed by the bonding of any two or more of $R_{1c}$ to $R_{5c}$, $R_{6c}$ and $R_{7c}$, and $R_x$ and $R_y$ include a butylene group and a pentylene group.

As groups formed by the bonding of $R_{5c}$ and $R_{6c}$, and $R_{5e}$ and $R_{6c}$ a single bond or alkylene group is preferable. Examples of the alkylene group include a methylene group and an ethylene group.

$Zc^-$ represents an anion.

Next, the compound (ZI-4) will be described.

The compound (ZI-4) is represented by General Formula (ZI-4).

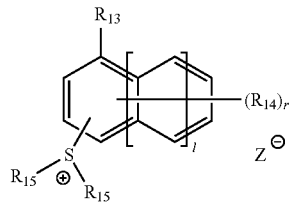

(ZI-4)

In General Formula (ZI-4), l represents an integer of 0 to 2.

r represents an integer of 0 to 8.

$R_{13}$ represents a hydrogen atom, a fluorine atom, a hydroxyl group, an alkyl group, a cycloalkyl group, an alkoxy group, an alkoxycarbonyl group, or a group having a cycloalkyl group. These groups may have a substituent.

$R_{14}$ represent a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have a substituent. In a case where $R_{14}$'s are present in plural number, $R_{14}$'s each independently represent the group such as a hydroxyl group as above.

$R_{15}$'s each independently represent an alkyl group, a cycloalkyl group, or a naphthyl group. These groups may have a substituent. Two $R_{15}$'s may be bonded to each other to form a ring. In a case where two $R_{15}$'s are bonded to form a ring, the ring skeleton may include a heteroatom such as an oxygen atom and a nitrogen atom. In one aspect, it is preferable that two $R_{15}$'s are alkylene groups, and are bonded to each other to form a ring structure.

$Z^-$ represents an anion.

In General Formula (ZI-4), the alkyl group of each of $R_{13}$, $R_{14}$, and $R_{15}$, an alkyl is linear or branched. The number of carbon atoms of the alkyl group is preferably 1 to 10. As the alkyl group, a methyl group, an ethyl group, an n-butyl group, a t-butyl group, or the like is more preferable.

Next, General Formulae (ZII) and (ZIII) will be described.

In General Formulae (ZII) and (ZIII), $R_{204}$ to $R_{207}$ each independently represent an aryl group, an alkyl group, or a cycloalkyl group.

As the aryl group of each of $R_{204}$ to $R_{207}$, a phenyl group or a naphthyl group is preferable, and the phenyl group is more preferable. The aryl group of each of $R_{204}$ to $R_{207}$ may be an aryl group having a heterocyclic structure having an oxygen atom, a nitrogen atom, a sulfur atom, or the like. Examples of the skeleton of the aryl group having a heterocyclic structure include pyrrole, furan, thiophene, indole, benzofuran, and benzothiophene.

Preferred examples of the alkyl group and the cycloalkyl group in each of $R_{204}$ to $R_{207}$ include a linear alkyl group having 1 to 10 carbon atoms or a branched alkyl group having 3 to 10 carbon atoms (for example, a methyl group, an ethyl group, a propyl group, a butyl group, and a pentyl group), and a cycloalkyl group having 3 to 10 carbon atoms (a cyclopentyl group, a cyclohexyl group, and a norbomyl group).

The aryl group, the alkyl group, and the cycloalkyl group of each of $R_{204}$ to $R_{207}$ may each independently have a substituent. Examples of the substituent which may be contained in the aryl group, the alkyl group, or the cycloalkyl group of each of $R_{204}$ to $R_{207}$ include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents an anion.

As each of $Z^-$ in General Formula (ZI), $Z^-$ in General Formula (ZII), $Zc^-$ in General Formula (ZI-3), and $Z^-$ in General Formula (ZI-4), an anion represented by General Formula (3) is preferable.

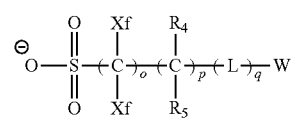

(3)

In General Formula (3), o represents an integer of 1 to 3. p represents an integer of 0 to 10. q represents an integer of 0 to 10.

Xf's each independently represent a fluorine atom or an alkyl group substituted with at least one fluorine atom. The number of carbon atoms of the alkyl group is preferably 1 to 10, and more preferably 1 to 4. In addition, as the alkyl group substituted with at least one fluorine atom, a perfluoroalkyl group is preferable.

Xf is preferably a fluorine atom or a perfluoroalkyl group having 1 to 4 carbon atoms, and more preferably a fluorine atom or $CF_3$. In particular, it is still more preferable that both Xf's are fluorine atoms.

$R_4$ and $R_5$ each independently represent a hydrogen atom, a fluorine atom, an alkyl group, or an alkyl group substituted with at least one fluorine atom. In a case where $R_4$'s and $R_5$'s are each present in plural number, $R_4$'s and $R_5$'s may be the same as or different from each other.

The alkyl group represented by each of $R_4$ and $R_5$ may have a substituent, and preferably has 1 to 4 carbon atoms. $R_4$ and $R_5$ are each preferably a hydrogen atom.

Specific examples and suitable embodiments of the alkyl group substituted with at least one fluorine atom are the same as the specific examples and suitable embodiments of Xf in General Formula (3).

L represents a divalent linking group. In a case where L's are present in plural number, L's may be the same as or different from each other.

Examples of the divalent linking group include —COO— (—C(=O)—O—), —OCO—, —CONH—, —NHCO—, —CO—, —O—, —S—, —SO—, —SO$_2$—, an alkylene group (preferably having 1 to 6 carbon atoms), a cycloalkylene group (preferably having 3 to 15 carbon atoms), an alkenylene group (preferably having 2 to 6 carbon atoms), or a divalent linking group formed by combination of these plurality of groups. Among those, —COO—, —COO—, —CONH—, —NHCO—, —CO—, —O—, —SO$_2$—, —COO-alkylene group-, —OCO-alkylene group-, —CONH-alkylene group-, or —NHCO— alkylene group- is preferable, and —COO—, —OCO—, —CONH—, —SO$_2$—, —COO-alkylene group-, or —OCO-alkylene group- is more preferable.

W represents an organic group including a cyclic structure. Above all, a cyclic organic group is preferable.

Examples of the cyclic organic group include an alicyclic group, an aryl group, and a heterocyclic group.

The alicyclic group may be monocyclic or polycyclic. Examples of the monocyclic alicyclic group include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among those, an alicyclic group having a bulky structure having 7 or more carbon atoms, such as a norbornyl group, a tricyclodecanyl group, a tetracyclodecanyl group, a tetracyclododecanyl group, and an adamantyl group, is preferable.

The aryl group may be monocyclic or polycyclic. Examples of the aryl group include a phenyl group, a naphthyl group, a phenanthryl group, and an anthryl group.

The heterocyclic group may be monocyclic or polycyclic. In a case where heterocyclic group is polycyclic, it is possible to suppress acid diffusion. In addition, the heterocyclic group may or may not have aromaticity. Examples of the heterocycle having aromaticity include a furan ring, a thiophene ring, a benzofuran ring, a benzothiophene ring, a dibenzofuran ring, a dibenzothiophene ring, and a pyridine ring. Examples of the heterocycle having no aromaticity include a tetrahydropyran ring, a lactone ring, a sultone ring, and a decahydroisoquinoline ring. Examples of the lactone ring and the sultone ring include the above-mentioned lactone structures and sultone structures exemplified in the resin. As the heterocycle in the heterocyclic group, a furan ring, a thiophene ring, a pyridine ring, or a decahydroisoquinoline ring is particularly preferable.

The cyclic organic group may have a substituent. Examples of the substituent include an alkyl group (which may be linear or branched, and preferably has 1 to 12 carbon atoms), a cycloalkyl group (which may be any one of a monocycle, a polycycle, or a spiro ring, and preferably has 3 to 20 carbon atoms), an aryl group (preferably having 6 to 14 carbon atoms), a hydroxyl group, an alkoxy group, an ester group, an amido group, a urethane group, a ureido group, a thioether group, a sulfonamido group, and a sulfonic acid ester group. Incidentally, the carbon constituting the cyclic organic group (carbon contributing to ring formation) may be carbonyl carbon.

As the anion represented by General Formula (3), SO$_3^-$—CF$_2$—CH$_2$—OCO—(L)q'-W, SO$_3^-$—CF$_2$—CHF—CH$_2$—OCO-(L)q'-W, SO$_3^-$—CF$_2$—COO-(L)q'-W, SO$_3^-$—CF$_2$—CF$_2$—CH$_2$—CH$_2$-(L)q-W, or SO$_3^-$—CF$_2$—CH(CF$_3$)—OCO-(L)q'-W is preferable. Here, L, q, and W are each the same as in General Formula (3). q' represents an integer of 0 to 10.

In one aspect, as each of Z' in General Formula (ZI), Z$^-$ in General Formula (ZII), Zc$^-$ in General Formula (ZI-3), and Z$^-$ in General Formula (ZI-4), an anion represented by General Formula (4) is also preferable.

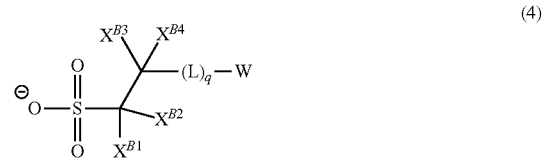

(4)

In General Formula (4), $X^{B1}$ and $X^{B2}$ each independently represent a hydrogen atom or a monovalent organic group having no fluorine atom. $X^{B1}$ and $X^{B2}$ are each preferably a hydrogen atom.

$X^{B3}$ and $X^{B4}$ each independently represent a hydrogen atom or a monovalent organic group. It is preferable that at least one of $X^{B3}$ or $X^{B4}$ is a fluorine atom or a monovalent organic group having a fluorine atom, and it is more preferable that both of $X^{B3}$ and $X^{B4}$ are a fluorine atom or a monovalent organic group having a fluorine atom. It is still more preferable that both of $X^{B3}$ and $X^{B4}$ are an alkyl group substituted with a fluorine atom.

L, q, and W are each the same as in General Formula (3).

Z$^-$ in General Formula (ZI), Z$^-$ in General Formula (ZII), Zc$^-$ in General Formula (ZI-3), and Z$^-$ in General Formula (ZI-4) may be each a benzenesulfonate anion, and are each preferably a benzenesulfonate anion substituted with a branched alkyl group or a cycloalkyl group.

As each of Z$^-$ in General Formula (ZI), Z$^-$ in General Formula (ZII), Zc$^-$ in General Formula (ZI-3), and Z in General Formula (ZI-4), an aromatic sulfonate anion represented by General Formula (SA1) is also preferable.

(SA1)

In Formula (SA1),

Ar represents an aryl group and may further have a substituent other than a sulfonate anion and a -(D-B) group. Examples of the substituent that may further be contained include a fluorine atom and a hydroxyl group.

n represents an integer of 0 or more. n is preferably 1 to 4, more preferably 2 or 3, and still more preferably 3.

D represents a single bond or a divalent linking group. Examples of the divalent linking group include an ether group, a thioether group, a carbonyl group, a sulfoxide group, a sulfone group, a sulfonic acid ester group, an ester group, and a group formed by combination of two or more of these groups.

B represents a hydrocarbon group.

It is preferable that D is a single bond and B is an aliphatic hydrocarbon structure. It is more preferable that B is an isopropyl group or a cyclohexyl group.

Preferred examples of the sulfonium cation in General Formula (ZI) and the iodonium cation in General Formula (ZII) are set forth below.

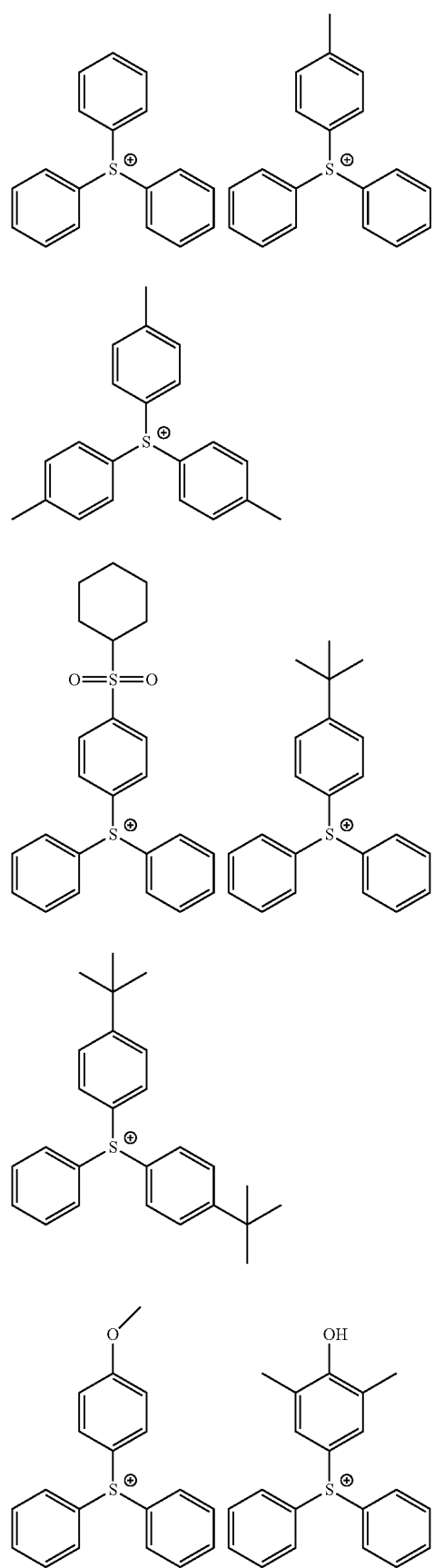
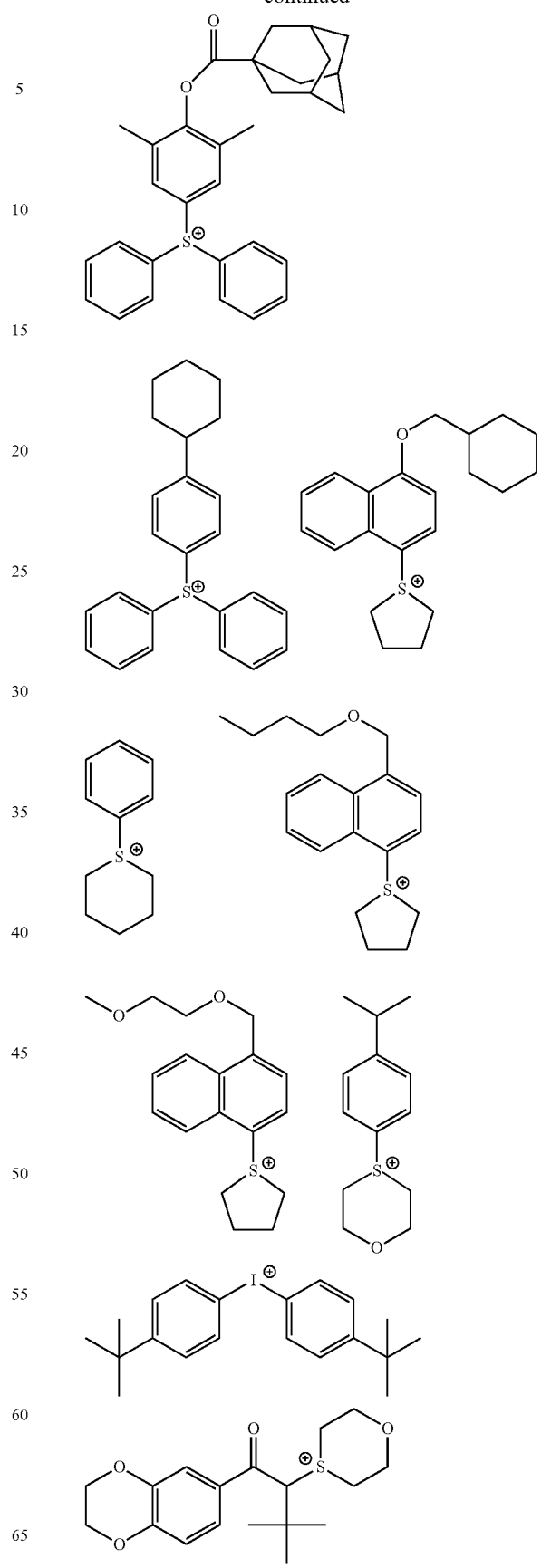

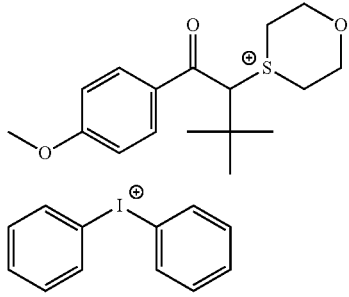
Preferred examples of the anions $Z^-$ in General Formula (ZI) and General Formula (ZII), $Zc^-$ in General Formula (ZI-3), and $Z^-$ in General Formula (ZI-4) are set forth below.
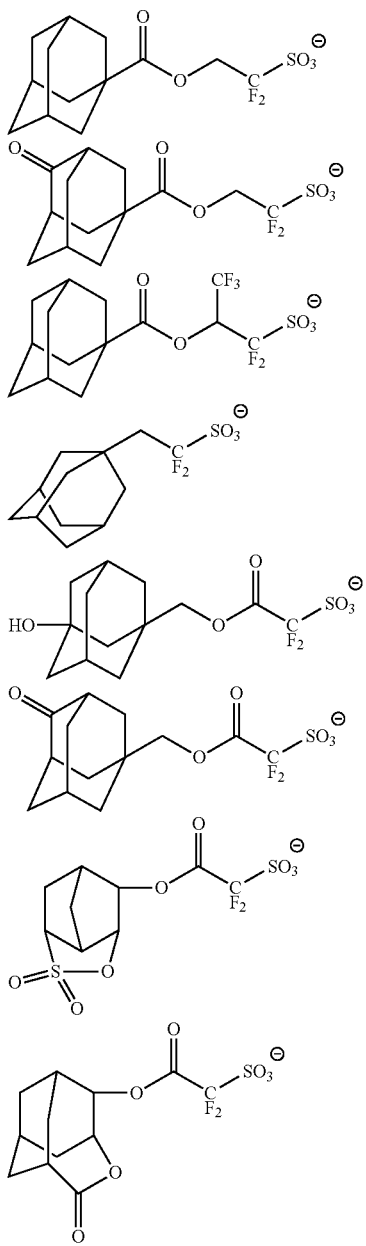
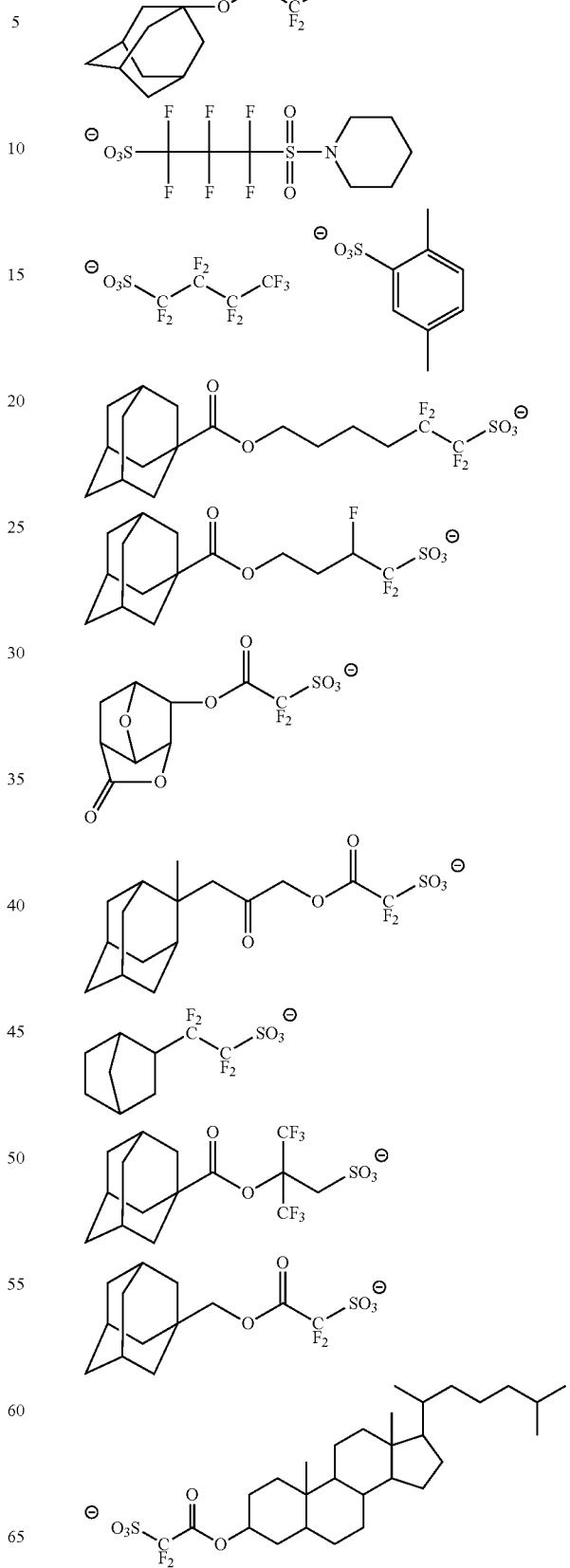

-continued

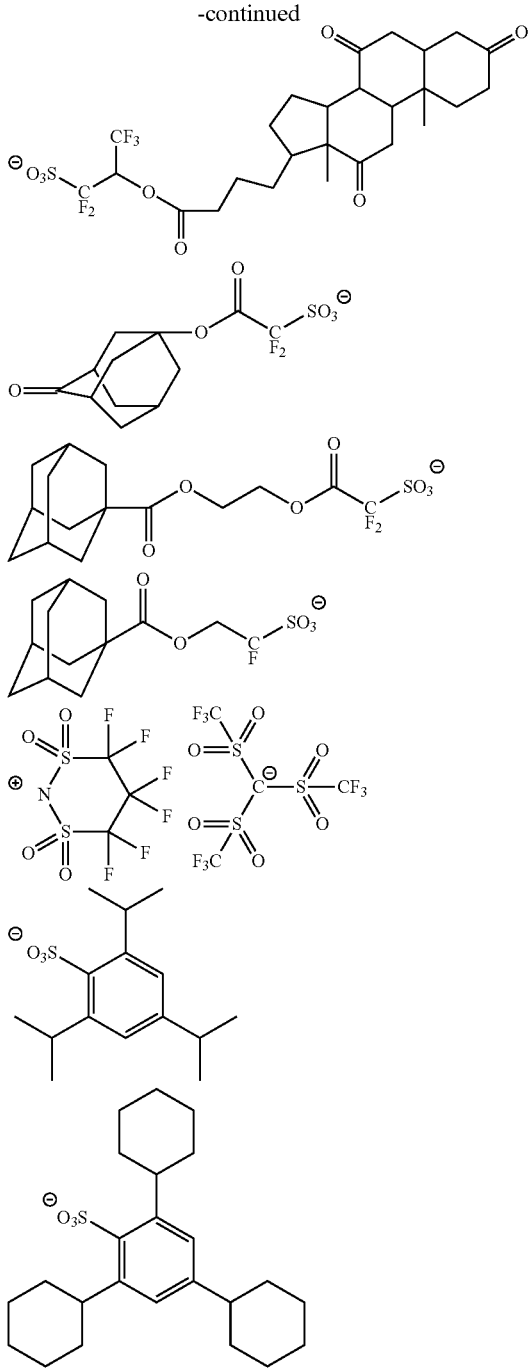

The cation and the anion can be optionally combined and used as a photoacid generator.

The photoacid generator may be in a form of a low molecular compound or in a form incorporated into a part of a polymer. In addition, a combination of the form of a low molecular compound and the form incorporated into a part of a polymer may also be used.

In the present invention, the photoacid generator is preferably in the form of the low molecular compound.

In a case where the photoacid generator is in the form of the low molecular compound, the molecular weight is preferably 3,000 or less, more preferably 2,000 or less, and still more preferably 1,000 or less.

In a case where the photoacid generator is in the form incorporated into a part of a polymer, it may be incorporated into a part of the above-mentioned resin (A) which will be described later or into a resin other than the resin (A).

The photoacid generator may be used singly or in combination of two or more kinds thereof.

The content of the photoacid generator (a total content in a case where the photoacid generators are present in plural number) in the composition of the embodiment of the present invention is preferably 0.1% to 35% by mass, more preferably 0.5% to 25% by mass, still more preferably 1% to 20% by mass, and particularly preferably 1% to 15% by mass, with respect to a total solid contents of the composition.

<Acid Diffusion Control Agent (D)>

The composition of the embodiment of the present invention preferably includes an acid diffusion control agent (D).

The acid diffusion control agent (D) acts as a quencher that inhibits a reaction of the acid-decomposable resin in the unexposed area by excessive generated acids by trapping the acids generated from a photoacid generator or the like upon exposure. For example, a basic compound (DA), a basic compound (DB) whose basicity is reduced or lost upon irradiation with actinic rays or radiation, an onium salt (DC) which becomes a relatively weak acid with respect to an acid generator, a low molecular compound (DD) which has a nitrogen atom and a group that leaves by the action of an acid, an onium salt compound (DE) having a nitrogen atom in a cationic moiety, or the like can be used as the acid diffusion control agent. In the composition of the embodiment of the present invention, a known acid diffusion control agent can be appropriately used. For example, the known compounds disclosed in paragraphs <0627> to <0664> of US2016/0070167A1, paragraphs <0095> to <0187> of US2015/0004544A1, paragraphs <0403> to <0423> of US2016/0237190A1, and paragraphs <0259> to <0328> of US2016/0274458A1 can be suitably used as the acid diffusion control agent (D).

As the basic compound (DA), compounds having structures represented by Formulae (A) to (E) are preferable.

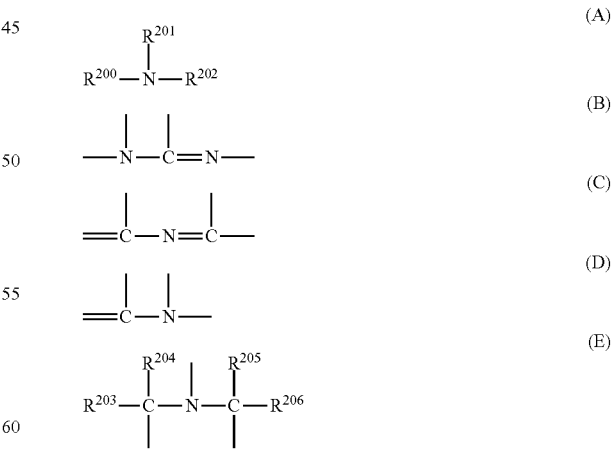

In General Formulae (A) and (E), $R^{200}$, $R^{201}$, and $R^{202}$ may be the same as or different from each other, and each independently represent a hydrogen atom, an alkyl group (preferably having 1 to 20 carbon atoms), a cycloalkyl group (preferably having 3 to 20 carbon atoms), or an aryl group (having 6 to 20 carbon atoms). $R^{201}$ and $R^{202}$ may be bonded to each other to form a ring.

$R^{203}$, $R^{204}$, $R^{205}$, and $R^{206}$ may be the same as or different from each other, and each independently represent an alkyl group having 1 to 20 carbon atoms.

The alkyl group in each of General Formulae (A) and (E) may have a substituent or may be unsubstituted.

With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

The alkyl groups in each of General Formulae (A) and (E) are more preferably unsubstituted.

As the basic compound (DA), guanidine, aminopyrrolidine, pyrazole, pyrazoline, piperazine, aminomorpholine, aminoalkylmorpholine, piperidine, or the like is preferable; and a compound having an imidazole structure, a diazabicyclo structure, an onium hydroxide structure, an onium carboxylate structure, a trialkylamine structure, an aniline structure, or a pyridine structure, an alkylamine derivative having a hydroxyl group and/or an ether bond, and an aniline derivative having a hydroxyl group and/or an ether bond, or the like is more preferable.

The basic compound (DB) whose basicity is reduced or lost upon irradiation with actinic rays or radiation (hereinafter also referred to as a "compound (DB)") is a compound which has a proton-accepting functional group, and decomposes under irradiation with actinic rays or radiation to exhibit deterioration in proton-accepting properties, no proton-accepting properties, or a change from the proton-accepting properties to acidic properties.

The proton-accepting functional group refers to a functional group having a group or an electron which is capable of electrostatically interacting with a proton, and for example, means a functional group with a macrocyclic structure, such as a cyclic polyether, or a functional group having a nitrogen atom having an unshared electron pair not contributing to it-conjugation. The nitrogen atom having an unshared electron pair not contributing to it-conjugation is, for example, a nitrogen atom having a partial structure represented by the following general formula.

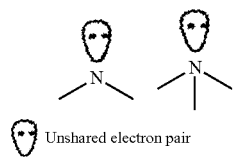

Unshared electron pair

Preferred examples of the partial structure of the proton-accepting functional group include a crown ether structure, an azacrown ether structure, primary to tertiary amine structures, a pyridine structure, an imidazole structure, and a pyrazine structure.

The compound (DB) decomposes upon irradiation with actinic rays or radiation to generate a compound exhibiting deterioration in proton-accepting properties, no proton-accepting properties, or a change from the proton-accepting properties to acidic properties. Here, exhibiting deterioration in proton-accepting properties, no proton-accepting properties, or a change from the proton-accepting properties to acidic properties means a change of proton-accepting properties due to the proton being added to the proton-accepting functional group, and specifically a decrease in the equilibrium constant at chemical equilibrium in a case where a proton adduct is generated from the compound (DB) having the proton-accepting functional group and the proton.

The proton-accepting properties can be confirmed by performing pH measurement.

In the present invention, the acid dissociation constant pKa of the compound generated by the decomposition of the compound (DB) upon irradiation with actinic rays or radiation preferably satisfies pKa<−1, more preferably −13<pKa<−1, and still more preferably −13<pKa<−3.

The acid dissociation constant pKa refers to an acid dissociation constant pKa in an aqueous solution, and is defined, for example, in Chemical Handbook (II) (Revised 4$^{th}$ Edition, 1993, compiled by the Chemical Society of Japan, Maruzen Company, Ltd.). A lower value of the acid dissociation constant pKa indicates higher acid strength. Specifically, the acid dissociation constant pKa in an aqueous solution can be measured by using an infinite-dilution aqueous solution and measuring the acid dissociation constant at 25° C. Alternatively, the acid dissociation constant pKa can also be determined using the following software package 1, by computation from a value based on a Hammett substituent constant and the database of publicly known literature values. Any of the values of pKa described in the present specification represent values determined by calculation using the software package.

Software package 1: Advanced Chemistry Development (ACD/Labs) Software V 8.14 for Solaris (1994-2007 ACD/Labs).

In the composition of the embodiment of the present invention, an onium salt (DC) which becomes a relatively weak acid with respect to the photoacid generator can be used as an acid diffusion control agent.

In a case of mixing the photoacid generator and the onium salt that generates an acid which is a relatively weak acid with respect to an acid generated from the photoacid generator, and then using the mixture, in a case where the acid generated from the photoacid generator upon irradiation with actinic rays or radiation collides with an onium salt having an unreacted weak acid anion, a weak acid is discharged by salt exchange, thereby generating an onium salt having a strong acid anion. In this process, the strong acid is exchanged with a weak acid having a lower catalytic ability, and therefore, the acid is deactivated in appearance, and thus, it is possible to carry out the control of acid diffusion.

As the onium salt which becomes a relatively weak acid with respect to the photoacid generator, compounds represented by General Formulae (dl-1) to (dl-3) are preferable.

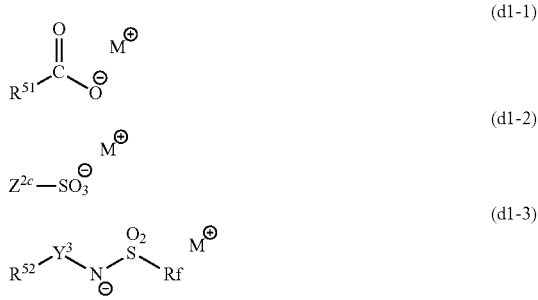

In the formulae, $R^{51}$ is a hydrocarbon group which may have a substituent, $Z^{2c}$ is a hydrocarbon group (provided that carbon adjacent to S is not substituted with a fluorine atom)

having 1 to 30 carbon atoms, which may have a substituent, $R^{52}$ is an organic group, $Y^3$ is a linear, branched, or cyclic alkylene group or arylene group, Rf is a hydrocarbon group including a fluorine atom, and M's are each independently an ammonium cation, a sulfonium cation, or an iodonium cation.

Preferred examples of the sulfonium cation or the iodonium cation represented by M⁺ include the sulfonium cations exemplified for General Formula (ZI) and the iodonium cations exemplified for General Formula (ZII) of the photoacid generator.

The onium salt (DC) which becomes a relatively weak acid with respect to the photoacid generator may be a compound (hereinafter also referred to as a "compound (DCA)") having a cationic moiety and an anionic moiety in the same molecule, in which the cationic moiety and the anionic moiety are linked to each other through a covalent bond.

As the compound (DCA), a compound represented by any one of General Formulae (C-1), . . . , or (C-3) is preferable.

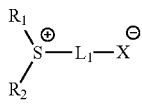
(C-1)

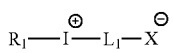
(C-2)

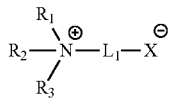
(C-3)

In General Formulae (C-1) to (C-3), $R_1$, $R_2$, and $R_3$ each independently represent a substituent having 1 or more carbon atoms.

$L_1$ represents a divalent linking group that links a cationic moiety with an anionic moiety, or a single bond.

—X⁻ represents an anionic moiety selected from —COO⁻, —SO₃⁻, —SO₂⁻, and —N⁻—R₄. R₄ represents a monovalent substituent having at least one of a carbonyl group (—C(=O)—), a sulfonyl group (—S(=O)₂—), or a sulfinyl group (—S(=O)—) at a site for linking to an adjacent N atom.

$R_1$, $R_2$, $R_3$, $R_4$, and $L_1$ may be bonded to one another to form a ring structure. Further, in General Formula (C-3), two of $R_1$ to $R_3$ may be combined to represent a divalent substituent or $R_1$ to $R_3$ may be bonded to an N atom through a double bond.

Examples of the substituent having 1 or more carbon atoms in each of $R_1$ to $R_3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group. The substituent is preferably the alkyl group, the cycloalkyl group, or the aryl group.

Examples of $L_1$ as a divalent linking group include a linear or branched alkylene group, a cycloalkylene group, an arylene group, a carbonyl group, an ether bond, ester bond, amide bond, a urethane bond, a urea bond, and a group formed by a combination of two or more of these groups. $L_1$ is preferably the alkylene group, the arylene group, the ether bond, the ester bond, and the group formed by a combination of two or more of these groups.

The low molecular compound (DD) (hereinafter referred to as a "compound (DD)") which has a nitrogen atom and a group that leaves by the action of an acid is preferably an amine derivative having a group that leaves by the action of an acid on a nitrogen atom.

As the group that leaves by the action of an acid, an acetal group, a carbonate group, a carbamate group, a tertiary ester group, a tertiary hydroxyl group, or a hemiaminal ether group are preferable, and the carbamate group or the hemiaminal ether group is particularly preferable.

The molecular weight of the compound (DD) is preferably 100 to 1,000, more preferably 100 to 700, and still more preferably 100 to 500.

The compound (DD) may have a carbamate group having a protecting group on a nitrogen atom. The protecting group constituting the carbamate group is represented by General Formula (d-1).

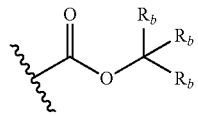
(d-1)

In General Formula (d-1), $R_b$'s each independently represent a hydrogen atom, an alkyl group (preferably having 1 to 10 carbon atoms), a cycloalkyl group (preferably having 3 to 30 carbon atoms), an aryl group (preferably having 3 to 30 carbon atoms), an aralkyl group (preferably having 1 to 10 carbon atoms), or an alkoxyalkyl group (preferably having 1 to 10 carbon atoms). $R_b$'s may be linked to each other to form a ring.

The alkyl group, the cycloalkyl group, the aryl group, and the aralkyl group represented by $R_b$ may be each independently substituted with a functional group such as a hydroxyl group, a cyano group, an amino group, a pyrrolidino group, a piperidino group, a morpholino group, and an oxo group, an alkoxy group, or a halogen atom. This shall apply to the alkoxyalkyl group represented by $R_b$.

$R_b$ is preferably a linear or branched alkyl group, a cycloalkyl group, or an aryl group, and more preferably the linear or branched alkyl group, or the cycloalkyl group.

Examples of a ring formed by the mutual linking of two $R_b$'s include an alicyclic hydrocarbon, an aromatic hydrocarbon, a heterocyclic hydrocarbon, and a derivative thereof.

Examples of the specific structure of the group represented by General Formula (d-1) include, but are not limited to, the structures disclosed in paragraph <0466> in US2012/0135348A1.

The compound (DD) preferably has a structure represented by General Formula (6).

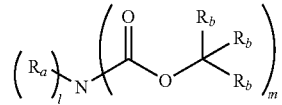
(6)

In General Formula (6), l represents an integer of 0 to 2, and m represents an integer of 1 to 3, satisfying l+m=3.

$R_a$ represents a hydrogen atom, an alkyl group, a cycloalkyl group, an aryl group, or an aralkyl group. In a case where 1 is 2, two $R_a$'s may be the same as or different from each other, and two $R_a$'s may be linked to each other to form a heterocycle together with the nitrogen atom in the formula. The heterocycle may include a heteroatom other than the nitrogen atom in the formula.

$R_b$ has the same meaning as $R_b$ in General Formula (d-1), and preferred examples thereof are also the same.

In General Formula (6), the alkyl group, the cycloalkyl group, the aryl group, and the aralkyl group as $R_a$ may be each independently substituted with the same groups as the groups mentioned above as a group which may be substituted in the alkyl group, the cycloalkyl group, the aryl group, and the aralkyl group as $R_b$.

Specific examples of the alkyl group, the cycloalkyl group, the aryl group, and the aralkyl group (these groups may be substituted with the groups as described above) of Ra each include the same groups as the specific examples as described above with respect to $R_b$.

Specific examples of the particularly preferred compound (DD) in the present invention include, but are not limited to, the compounds disclosed in paragraph <0475> in US2012/0135348A1.

The onium salt compound (DE) (hereinafter also referred to as a "compound (DE)") having a nitrogen atom in a cation moiety is preferably a compound having a basic site including a nitrogen atom in a cation moiety. The basic site is preferably an amino group, and more preferably an aliphatic amino group. It is more preferable that all of the atoms adjacent to the nitrogen atom in the basic site are hydrogen atoms or carbon atoms. In addition, from the viewpoint of improving the basicity, it is preferable that an electron-withdrawing functional group (a carbonyl group, a sulfonyl group, a cyano group, a halogen atom, and the like) is not directly linked to the nitrogen atom.

Specific preferred examples of the compound (DE) include, but are not limited to, the compounds disclosed in paragraph <0203> of US2015/0309408A1.

Preferred examples of the acid diffusion control agent (D) are set forth below.

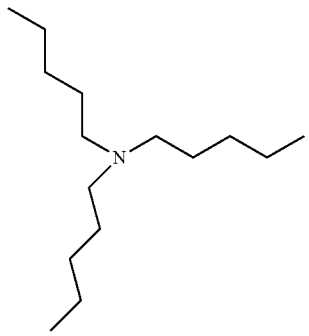

-continued

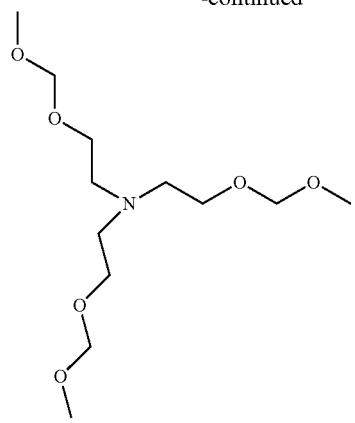

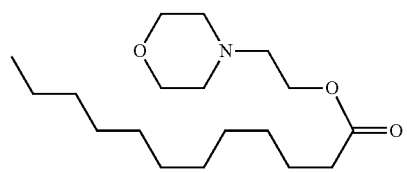

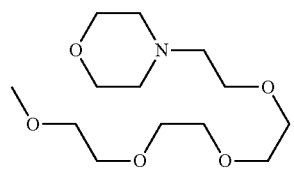

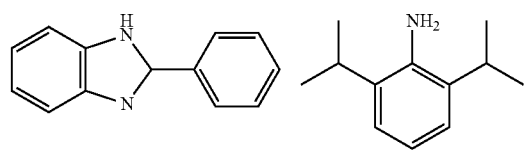

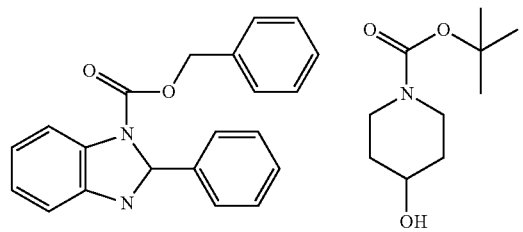

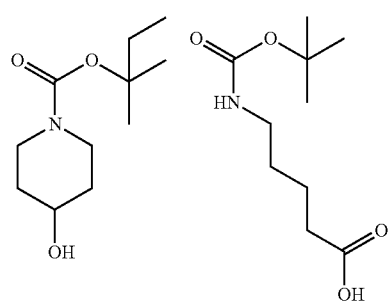

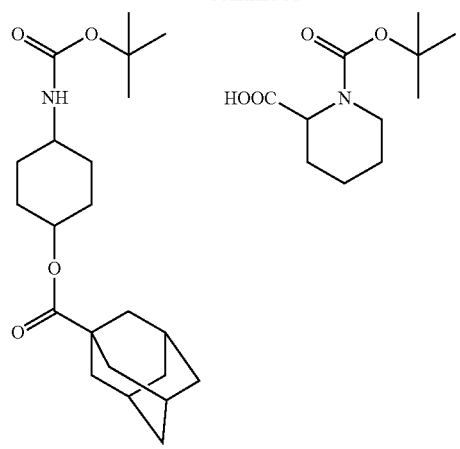
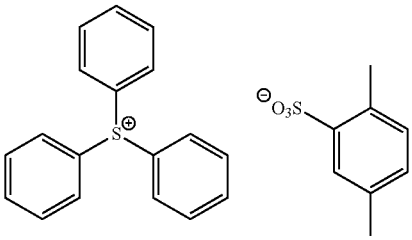
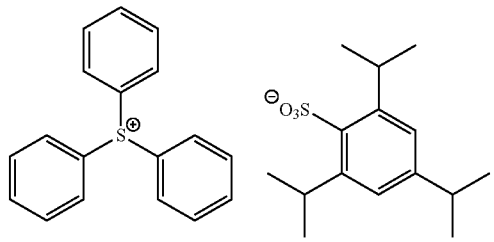
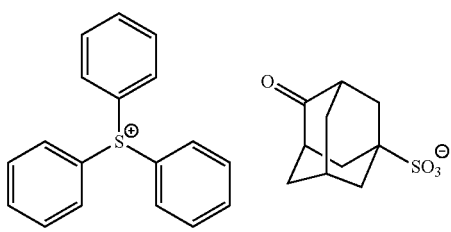
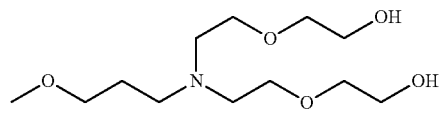
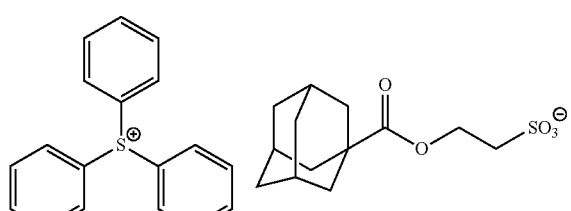
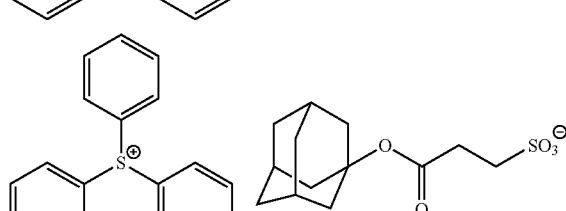
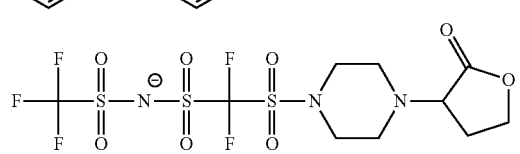
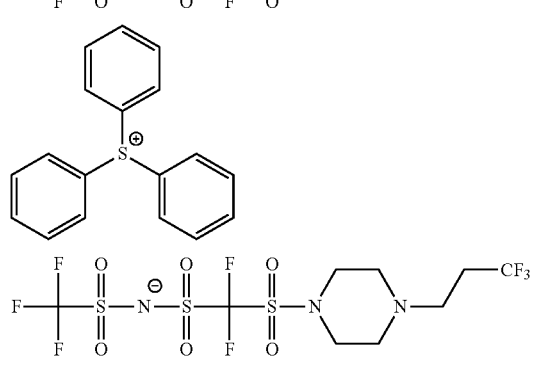
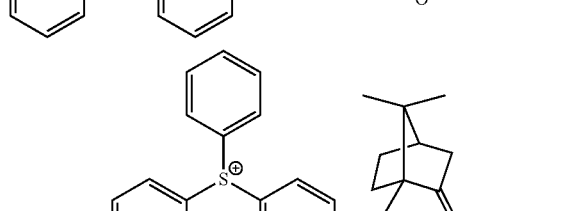
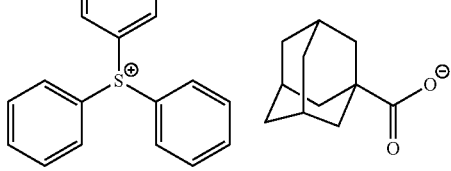

-continued

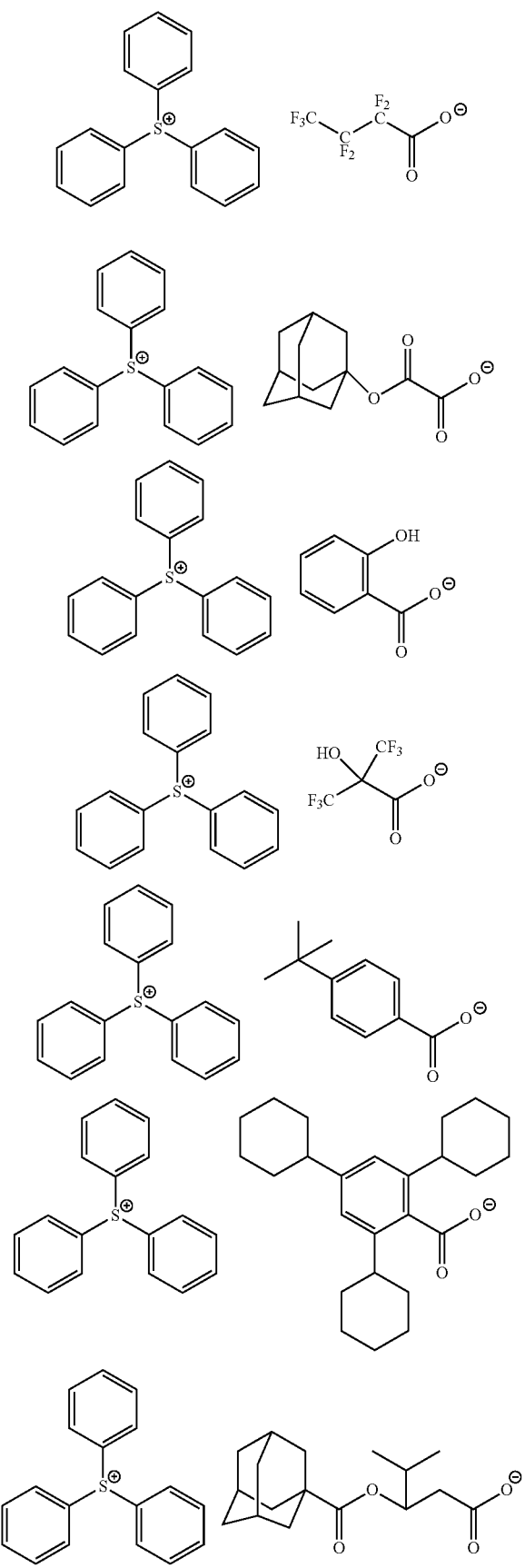
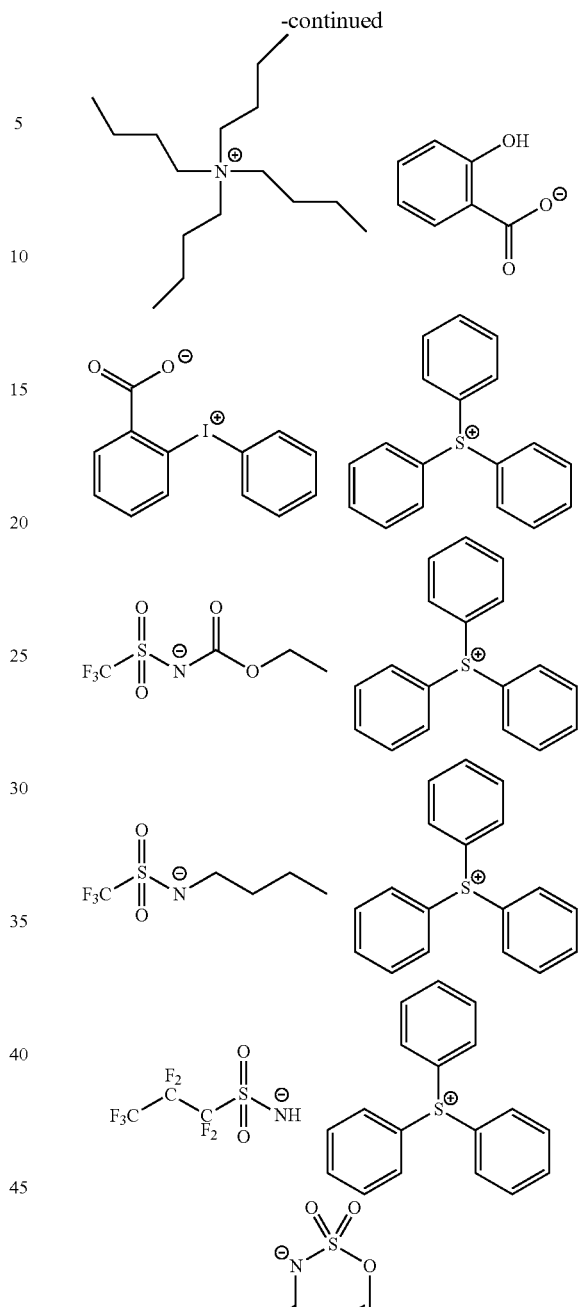

In the composition of the embodiment of the present invention, the acid diffusion control agent (D) may be used singly or in combination of two or more kinds thereof.

The content of the acid diffusion control agent (a total content in a case where the acid diffusion control agents (D) are present in plural number) in the composition is preferably 0.01% to 10% by mass, and more preferably 0.01% to 5% by mass, with respect to a total solid content of the composition.

<Solvent (E)>

The composition of the embodiment of the present invention preferably includes a solvent.

In the composition of the embodiment of the present invention, a known resist solvent can be appropriately used. For example, the known solvents disclosed in paragraphs <0665> to <0670> of US2016/0070167A1, paragraphs <0210> to <0235> of US2015/0004544A1, paragraphs <0424> to <0426> of US2016/0237190A1, and paragraphs <0357> to <0366> of US2016/0274458A1 can be suitably used.

Examples of the solvent which can be used in the preparation of the composition include organic solvents such as alkylene glycol monoalkyl ether carboxylate, alkylene glycol monoalkyl ether, alkyl lactate ester, alkyl alkoxypropionate, a cyclic lactone (preferably having 4 to 10 carbon atoms), a monoketone compound (preferably having 4 to 10 carbon atoms) which may have a ring, alkylene carbonate, alkyl alkoxyacetate, and alkyl pyruvate.

A mixed solvent obtained by mixing a solvent including a hydroxyl group in the structure and a solvent including no hydroxyl group in the structure may be used as the organic solvent.

As the solvent including a hydroxyl group and the solvent including no hydroxyl group, the above-mentioned exemplary compounds can be appropriately selected, but as the solvent including a hydroxyl group, alkylene glycol monoalkyl ether, alkyl lactate, or the like is preferable, and propylene glycol monomethyl ether (PGME), propylene glycol monoethyl ether (PGEE), methyl 2-hydroxyisobutyrate, or ethyl lactate is more preferable. In addition, as the solvent including no hydroxyl group, alkylene glycol monoalkyl ether acetate, alkyl alkoxy propionate, a monoketone compound which may contain a ring, cyclic lactone, alkyl acetate, or the like is preferable, and among those, propylene glycol monomethyl ether acetate (PGMEA), ethyl ethoxypropionate, 2-heptanone, γ-butyrolactone, cyclohexanone, cyclopentanone, or butyl acetate is more preferable, and propylene glycol monomethyl ether acetate, γ-butyrolactone, ethyl ethoxypropionate, cyclohexanone, cyclopentanone, or 2-heptanone is still more preferable. As the solvent including no hydroxyl group propylene carbonate is also preferable.

The mixing ratio (mass ratio) of the solvent including a hydroxyl group and the solvent including no hydroxyl group is 1/99 to 99/1, preferably 10/90 to 90/10, and more preferably 20/80 to 60/40. A mixed solvent including 50% by mass or more of the solvent including no hydroxyl group is preferable from the viewpoint of coating evenness.

The solvent preferably includes propylene glycol monomethyl ether acetate, and may be either a single solvent formed of propylene glycol monomethyl ether acetate or a mixed solvent of two or more kinds of solvents including propylene glycol monomethyl ether acetate.

<Crosslinking Agent (F)>

The composition of the embodiment of the present invention may include a compound that crosslinks a resin by the action of an acid (hereinafter also referred to as a crosslinking agent (F)). As the crosslinking agent (F), a known compound can be appropriately used. For example, the known compounds disclosed in paragraphs <0379> to <0431> of US2016/0147154A1 and paragraphs <0064> to <0141> of US2016/0282720A1 can be suitably used as the crosslinking agent (F).

The crosslinking agent (F) is a compound having a crosslinkable group which can crosslink a resin, and examples of the crosslinkable group include a hydroxymethyl group, an alkoxymethyl group, an acyloxymethyl group, an alkoxymethyl ether group, an oxirane ring, and an oxetane ring.

The crosslinkable group is preferably a hydroxymethyl group, an alkoxymethyl group, an oxirane ring, or an oxetane ring.

The crosslinking agent (F) is preferably a compound (which also includes a resin) having two or more crosslinkable groups.

The crosslinking agent (F) is preferably a phenol derivative, a urea-based compound (compound having a urea structure), or a melamine-based compound (compound having a melamine structure), which has a hydroxymethyl group or an alkoxymethyl group.

The crosslinking agent may be used singly or in combination of two or more kinds thereof.

The content of the crosslinking agent (F) is preferably 1% to 50% by mass, more preferably 3% to 40% by mass, and still more preferably 5% to 30% by mass, with respect to a total solid content of the resist composition.

<Surfactant (G)>

The composition of the embodiment of the present invention preferably includes a surfactant. In a case where the composition includes the surfactant, a fluorine-based and/or silicon-based surfactant (specifically a fluorine-based surfactant, a silicon-based surfactant, or a surfactant having both of a fluorine atom and a silicon atom) is preferable.

By incorporating the surfactant into the composition of the embodiment of the present invention, a pattern which has excellent adhesiveness and decreased development defects with good sensitivity and resolution in a case of using an exposure light source of 250 nm or less, and particularly 220 nm or less is obtained.

Examples of the fluorine-based and/or silicon-based surfactant include the surfactants described in paragraph <0276> of US2008/0248425A.

In addition, another surfactant other than the fluorine-based and/or silicon-based surfactant, described in paragraph <0280> of US2008/0248425A can also be used.

These surfactants may be used alone or in combination of two or more kinds thereof.

In a case where the composition of the embodiment of the present invention includes a surfactant, the content of the surfactant is preferably 0.0001% to 2% by mass, and more preferably 0.0005% to 1% by mass, with respect to a total solid content of the composition.

(Other Additives)

The composition of the embodiment of the present invention may further include an acid proliferation agent, a dye, a plasticizer, a light sensitizer, a light absorber, an alkali-soluble resin, a dissolution inhibitor, a dissolution promoter, or the like.

<Preparation Method>

The concentration of the solid content of the composition of the embodiment of the present invention is typically 1.0% by mass or more, and from the viewpoint that a pattern of a thicker film can be formed, the concentration is preferably 10% by mass or more, more preferably 20% by mass, and still more preferably 30% by mass. An upper limit thereof is not particularly limited, but is, for example, 50% by mass or less. In addition, the concentration of the solid content refers to a mass percentage of the mass of other resist components excluding the solvent with respect to a total mass of the composition.

The composition of the embodiment of the present invention is used after being applied onto a predetermined support (substrate) to be used after dissolving the above-mentioned components in a predetermined organic solvent, and preferably the mixed solvent, and filtering. A pore size of a filter used in the filtration using the filter is preferably 0.1 μm or less, more preferably 0.05 μm or less, and still more preferably 0.03 μm or less. The filter is preferably a polytetrafluoroethylene-made, polyethylene-made, or nylon-made filter. In the filtration using a filter, as described in, for example, JP2002-062667A, circulating filtration may be performed or the filtration may be performed by connecting plural kinds of filters in series or in parallel. In addition, the composition may be filtered in plural times. Furthermore, the composition may be subjected to a deaeration treatment or the like before or after filtration using a filter.

The composition of the embodiment of the present invention preferably has a viscosity of 100 to 500 mPa·s. The viscosity of the composition of the embodiment of the present invention is more preferably 100 to 300 mPa·s from the viewpoint that the coatability is more excellent.

In addition, the viscosity can be measured with an E type viscometer.

Moreover, the film thickness of a resist film formed of the composition of the embodiment of the present invention (in other words, a coating film of the actinic ray-sensitive or radiation-sensitive resin composition) is, for example, 2 μm or more, and from the viewpoint that ion leakage in an ion implanting step can be further suppressed, the film thickness is more preferably 5 μm or more, and still more preferably 7 μm or more. An upper limit thereof is not particularly limited, but is, for example, 15 μm or less.

In addition, a pattern can be formed from the composition of the embodiment of the present invention, as described later.

Furthermore, the film thickness of a pattern thus formed is, for example, 2 μm or more, and from the viewpoint that ion leakage in an ion implanting step can be further suppressed, the film thickness is more preferably 5 μm or more, and still more preferably 7 μm or more. The upper limit is not particularly limited, but is, for example, 15 μm or less.

Furthermore, from the viewpoint that ion leakage in an ion implanting step can be further suppressed, the film density of a pattern thus formed is preferably 1.05 $g/cm^3$ or more, and more preferably 1.10 $g/cm^3$ or more.

Furthermore, the film density is intended to mean a film density of a film having a film thickness of 9 μm, obtained by forming applying the composition of the embodiment of the present invention onto a substrate to form a coating film, and then baking the coating film at 150° C. for 90 seconds.

<Applications>

The composition of the embodiment of the present invention relates to an actinic ray-sensitive or radiation-sensitive resin composition whose properties change by undergoing a reaction upon irradiation with actinic rays or radiation. More specifically, the composition of the embodiment of the present invention relates to an actinic ray-sensitive or radiation-sensitive resin composition which is used in a step of manufacturing a semiconductor such as an integrated circuit (IC), for the manufacture of a circuit board for a liquid crystal, a thermal head, or the like, the manufacture of a mold structure for imprinting, other photofabrication steps, or production of a planographic printing plate or an acid-curable composition. A pattern formed in the present invention can be used in an etching step, an ion implantation step, a bump electrode forming step, a rewiring forming step, a microelectromechanical system (MEMS), or the like.

Among those, the composition of the embodiment of the present invention is preferably used in the ion implanting step for forming a light receiving portion (in other words, a light receiving portion that senses infrared rays) for an infrared ray transmitting filter that selectively transmits an infrared ray component in a manufacture of a solid-state imaging element including the infrared transmitting filter.

[Pattern Forming Method]

The present invention also relates to a pattern forming method using the actinic ray-sensitive or radiation-sensitive resin composition. Hereinafter, the pattern forming method of the embodiment of the present invention will be described. In addition, the resist film (in other words, a coating film of the actinic ray-sensitive or radiation-sensitive resin composition) of the embodiment of the present invention will also be described, together with the pattern forming method.

The pattern forming method of the embodiment of the present invention includes:

(i) a step of forming a resist film on a support with the above-mentioned actinic ray-sensitive or radiation-sensitive resin composition (resist film forming step), (ii) a step of exposing the resist film (irradiating actinic rays or radiation) (exposing step), and (iii) a step of developing the exposed resist film with a developer (developing step).

The pattern forming method of the embodiment of the present invention is not particularly limited as long as it includes the steps (i) to (iii), and may further include the following steps.

In the pattern forming method of the embodiment of the present invention, the exposing method in the exposing step (ii) may be liquid immersion exposure.

The pattern forming method of the embodiment of the present invention preferably includes a prebaking (PB) step (iv) before the exposing step (ii).

The pattern forming method of the embodiment of the present invention preferably includes a post-exposure baking (PEB) step (v) after the exposing step (ii) and before the developing step (iii).

The pattern forming method of the embodiment of the present invention may include the exposing step (ii) a plurality of times.

The pattern forming method of the embodiment of the present invention may include the prebaking heating step (iv) a plurality of times.

The pattern forming method of the embodiment of the present invention may include the post-exposure baking step (v) a plurality of times.

In the pattern forming method of the embodiment of the present invention, the above-mentioned film forming step (i), exposing step (ii), and developing step (iii) can be carried out by a generally known method.

In addition, a resist underlayer film (for example, spin on glass (SOG), spin on carbon (SOC), and an antireflection film) may be formed between the resist film and the support, as desired. As a material constituting the resist underlayer film, known organic or inorganic materials can be appropriately used.

A protective film (topcoat) may be formed on the upper layer of the resist film. As the protective film, a known material can be appropriately used. For example, the compositions for forming a protective film disclosed in US2007/0178407A, US2008/0085466A, US2007/0275326A, US2016/0299432A, US2013/0244438A, or the specification of WO2016/157988A can be suitably used. The composition for forming a protective film preferably includes the above-mentioned acid diffusion control agent.

The support is not particularly limited, and a substrate which is generally used in a step of manufacturing a semiconductor such as an IC, and a process for manufacturing a circuit board for a liquid crystal, a thermal head, or the like, and other lithographic processes of photofabrication can be used. Specific examples of the support include an inorganic substrate such as silicone, $SiO_2$, and SiN.

For any of the prebaking step (iv) and the post-exposure baking step (v), the heating temperature is preferably 70° C. to 130° C., and more preferably 80° C. to 120° C.

For any of the prebaking step (iv) and the post-exposure baking step (v), the heating time is preferably 30 to 300 seconds, more preferably 30 to 180 seconds, and still more preferably 30 to 90 seconds.

Heating may be performed using a means comprised in an exposure device and a development device, or may also be performed using a hot plate or the like.

The light source wavelength used in the exposing step is not particularly limited, and examples thereof include infrared rays, visible light, ultraviolet rays, far ultraviolet rays, extreme ultraviolet rays (EUV), X-rays, and electron beams. Among those, far ultraviolet rays are preferable, whose wavelength is preferably 250 nm or less, more preferably 220 nm or less, and still more preferably 1 to 200 nm. Specific examples thereof include a KrF excimer laser (248 nm), an ArF excimer laser (193 nm), an $F_2$ excimer laser (157 nm), X-rays, EUV (13 nm), and electron beams, and the KrF excimer laser, the ArF excimer laser, EUV, or the electron beams are preferable, and the KrF excimer laser is more preferable.

The developer used in the developing step (iii) may be either an alkali developer or a developer including an organic solvent (hereinafter also referred to as an "organic developer").

As the alkali developer, a quaternary ammonium salt typified by tetramethylammonium hydroxide is usually used, but in addition to the developer, an aqueous alkali solution such as an inorganic alkali, primary to tertiary amines, alcohol amine, and cyclic amine can also be used.

In addition, the alkali developer may include an appropriate amount of alcohols and/or a surfactant. The alkali concentration of the alkali developer is usually 0.1% to 20% by mass. The pH of the alkali developer is usually 10 to 15.

The time for performing development using the alkali developer is usually 10 to 300 seconds.

The alkali concentration, the pH, and the development time using the alkali developer can be appropriately adjusted depending on a pattern formed.

As the organic developer, a developer including at least one organic solvent selected from the group consisting of a ketone-based solvent, an ester-based solvent, an alcohol-based solvent, an amide-based solvent, an ether-based solvent, and hydrocarbon-based solvents is preferable.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, butyl butanoate, methyl 2-hydroxyisobutyrate, isoamyl acetate, isobutyl isobutyrate, and butyl propionate.

As the alcohol-based solvent, the amide-based solvent, the ether-based solvent, and the hydrocarbon-based solvent, the solvents disclosed in paragraphs <0715> to <0718> of US2016/0070167A1 can be used.

A plurality of the solvents may be mixed or the solvent may be used in admixture with a solvent other than those described above or water. The moisture content in the entire developer is preferably less than 50% by mass, more preferably less than 20% by mass, and still more preferably less than 10% by mass, and particularly preferably, the moisture is not substantially included.

The content of the organic solvent with respect to the organic developer is preferably 50% to 100% by mass, more preferably 80% to 100% by mass, still more preferably 90% to 100% by mass, and particularly preferably 95% to 100% by mass, with respect to a total amount of the developer.

The organic developer may include an appropriate amount of a known surfactant, as desired.

The content of the surfactant is usually 0.001% to 5% by mass, preferably 0.005% to 2% by mass, and still more preferably 0.01% to 0.5% by mass, with respect to a total amount of the developer.

The organic developer may include the above-mentioned acid diffusion control agent.

Examples of the developing method include a method in which a substrate is immersed in a tank filled with a developer for a certain period of time (a dip method), a method in which development is performed by heaping a developer up onto the surface of a substrate by surface tension, and then leaving it to stand for a certain period of time (a puddle method), a method in which a developer is sprayed on the surface of a substrate (a spray method), and a method in which a developer is continuously discharged onto a substrate spun at a constant rate while scanning a developer discharging nozzle at a constant rate (a dynamic dispense method).

A combination of a step of performing development using an aqueous alkali solution (an alkali developing step) and a step of performing development using a developer including an organic solvent (an organic solvent developing step) may be used. Thus, a finer pattern can be formed since a pattern can be formed by keeping only a region with an intermediate exposure intensity from not being dissolved.

It is preferable that a step of performing washing using a rinsing liquid (a rinsing step) is included after the developing step (iii).

As the rinsing liquid used in the rinsing step after the step of performing development with an alkali developer, for example, pure water can be used. Pure water may include an appropriate amount of a surfactant. In this case, after the developing step or the rinsing step, a treatment for removing the developer or the rinsing liquid adhering on a pattern by a supercritical fluid may be added. In addition, after the rinsing treatment or the treatment using a supercritical fluid, a heating treatment for removing moisture remaining in the pattern may be performed.

The rinsing liquid used in the rinsing step after the step of performing development using a developer including an organic solvent is not particularly limited as long as the rinsing liquid does not dissolve the resist pattern, and a solution including a common organic solvent can be used. As the rinsing liquid, a rinsing liquid including at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent include the same solvents as those described for the developer including an organic solvent.

As the rinsing liquid used in the rinsing step in this case, a rinsing liquid including a monohydric alcohol is more preferable.

Examples of the monohydric alcohol used in the rinsing step include linear, branched, or cyclic monohydric alcohols. Specific examples of the monohydric alcohol include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, and methyl isobutyl carbinol. Examples of the monohydric alcohol having 5 or more carbon atoms include 1-hexanol, 2-hexanol, 4-methyl-2-pentanol, 1-pentanol, 3-methyl-1-butanol, and methyl isobutyl carbinol.

The respective components in plural number may be mixed or the components may be used in admixture with an organic solvent other than the above solvents.

The moisture content in the rinsing liquid is preferably 10% by mass or less, more preferably 5% by mass or less, and still more preferably 3% by mass or less. By setting the moisture content to 10% by mass or less, good development characteristics are obtained.

In the rinsing step, the substrate that has been subjected to development using an organic developer is subjected to a washing treatment using a rinsing liquid including an organic solvent. Further, the rinsing liquid may include an appropriate amount of a surfactant.

A method for the washing treatment method is not particularly limited, but examples thereof include a method in which a rinsing liquid is continuously jetted on a substrate rotated at a constant rate (a rotation application method), a method in which a substrate is immersed in a tank filled with a rinsing liquid for a certain period of time (a dip method), and a method in which a rinsing liquid is sprayed on a substrate surface (a spray method). Among those, it is preferable that a washing treatment is carried out using the rotation application method, and a substrate is rotated at a rotation speed of 2,000 to 4,000 revolutions per minute (rpm) after washing, thereby removing the rinsing liquid from the substrate. Furthermore, it is also preferable that the method includes a baking step after the rinsing step (post-baking). The developer and the rinsing liquid remaining between and inside the patterns are removed by the baking step. In the heating step after the rinsing step, the heating temperature is usually 40° C. to 160° C., and preferably 70° C. to 95° C., and typically for 10 seconds to 3 minutes, and preferably for 30 seconds to 90 seconds.

It is preferable that various materials (for example, a resist solvent, a developer, a rinsing liquid, a composition for forming an antireflection film, and a composition for forming a topcoat) used in the actinic ray-sensitive or radiation-sensitive resin composition of the embodiment of the present invention, and the pattern forming method of the embodiment of the present invention do not include impurities such as metals. The content of the impurities included in these materials is preferably 1 ppm or less, more preferably 100 ppt or less, and still more preferably 10 ppt or less, and particularly preferably, the impurities are not substantially included (no higher than a detection limit of a measurement device).

Examples of a method for removing impurities such as metals from the various materials include filtration using a filter. As for the filter pore diameter, the pore size is preferably 10 nm or less, more preferably 5 run or less, and still more preferably 3 nm or less. As for the materials of a filter, a polytetrafluoroethylene-made filter, a polyethylene-made filter, and a nylon-made filter are preferable. As the filter, a filter which had been washed with an organic solvent in advance may be used. In the step of filtration using a filter, plural kinds of filters connected in series or in parallel may be used. In a case of using the plural kinds of filters, a combination of filters having different pore diameters and/or materials may be used. In addition, various materials may be filtered plural times, and the step of filtering plural times may be a circulatory filtration step. As the filter, a filter having a reduced amount of elutes as disclosed in JP2016-201426A is preferable.

In addition to the filtration using a filter, removal of impurities by an adsorbing material may be performed, or a combination of filtration using a filter and an adsorbing material may be used. As the adsorbing material, known adsorbing materials can be used, and for example, inorganic adsorbing materials such as silica gel and zeolite, and organic adsorbing materials such as activated carbon can be used. Examples of the metal adsorbing agent include those disclosed in JP2016-206500A.

In addition, as a method for reducing the impurities such as metals included in various materials include a method of selecting raw materials having a small content of metals as raw materials constituting various materials, a method of subjecting raw materials constituting various materials to filtration using a filter, and a method of performing distillation under the condition with contamination being suppressed to the largest degree by, for example, lining the inside of a device with TEFLON (registered trademark). Preferred conditions for performing filtration through a filter on the raw material constituting the temporary bonding material are the same as the conditions described above.

In order to prevent impurities from being incorporated, it is preferable that various materials are stored in the container described in US2015/0227049A, JP2015-123351A, or the like.

A method for improving the surface roughness of a pattern may be applied to a pattern formed by the pattern forming method of the embodiment of the present invention. Examples of the method for improving the surface roughness of a pattern include the method of treating a pattern by plasma of a hydrogen-containing gas disclosed in US2015/0104957A. In addition, known methods as described in JP2004-235468A, US2010/0020297A, and Proc. of SPIE Vol. 832883280N-1 "EUV Resist Curing Technique for LWR Reduction and Etch Selectivity Enhancement" may be applied.

[Method for Manufacturing Solid-State Imaging Element]

The method for manufacturing a solid-state imaging element of the embodiment of the present invention is a method for manufacturing a solid-state imaging element, the method including the above-mentioned pattern forming method, in which the method includes:
   (i) an ion implanting step of forming a light receiving portion that senses infrared rays, by implanting ions into an unmasked region of a substrate with a pattern formed on the substrate as a mask (ion implanting step);
   (ii) a step of removing the pattern from the substrate (mask removing step); and
   (iii) an infrared transmitting filter layer disposing step of disposing an infrared transmitting filter layer on an ion-implanted region of the substrate (infrared transmitting filter layer disposing step).

In the ion implanting step (i), the film thickness of the pattern used as the mask is, for example, 2 µm or more, more preferably 5 μm or more, and still more preferably 7 μm or more. An upper limit thereof is not particularly limited, but is, for example, 15 μm or less.

Moreover, with regard to the ion implanting step (i), a known method can be used. For example, reference can be made to JP5241883B and the like.

Furthermore, with regard to the mask removing step (ii) and the infrared transmitting filter layer disposing step (iii), a known method can be used. For example, reference can be made to JP2015-063593A and the like.

EXAMPLES

Hereinbelow, the present invention will be described in more detail with reference to Examples. The materials, the amounts of materials used, the proportions, the treatment details, the treatment procedure, or the like shown in the Examples below may be modified as appropriate as long as the modifications do not depart from the spirit of the present invention. Therefore, the scope of the present invention should not be construed as being limited to the Examples set forth below. In addition, "parts" and "%" are based on mass unless otherwise specified.

[Preparation of Actinic Ray-Sensitive or Radiation-Sensitive Resin Composition]

Various components included in an actinic ray-sensitive or radiation-sensitive resin composition shown in Table 1 are set forth below.

<Preparation of Actinic Ray-Sensitive or Radiation-Sensitive Resin Composition>

The respective components shown in Table 1 were mixed such that the mixture reached a concentration of the solid content described in Table 1. Subsequently, the obtained mixed liquid was filtered through a polyethylene filter having a pore size of 3 μm to prepare an actinic ray-sensitive or radiation-sensitive resin composition (hereinafter also referred to as a "resist composition"). Further, in the resist composition, the solid content means all the components excluding the solvent. In addition, the concentration of the solid content of the resist composition was adjusted to the content of the solvent, and the film thickness was adjusted to the one described in Table 2.

The obtained resist composition was used in Examples and Comparative Examples.

Furthermore, the amounts of 25 species of metal impurity components (Na, K, Ca, Fe, Cu, Mg, Mn, Al, Li, Cr, Ni, Sn, Zn, Ag, As, Au, Ba, Cd, Co, Pb, Ti, V, W, Mo, and Zr) included in the obtained resist composition were measured with "Agilent 7500cs", an ICP-MS device (inductively-coupled plasma mass spectrometer) manufactured by Agilent Technologies, inc., and thus, the content of each metal species was less than 10 ppb.

Various components included in the resist composition shown in Table 1 are set forth below.

<Resin>

The structures of resins A to E shown in Table 1 are set forth below. In addition, the weight-average molecular weights (Mw), the dispersities (Mw/Mn), and the glass transition temperatures (Tg (° C.)) of the resins A to E are shown in Table 1.

Furthermore, the weight-average molecular weights (Mw) and the dispersities (Mw/Mn) of the resins A to E were measured by means of GPC (carrier: tetrahydrofuran (THF)) (values in terms of polystyrene). In addition, the compositional ratios (ratios in % by mole) of the resins A to E were measured by means of $^{13}$C-nuclear magnetic resonance (NMR).

In addition, the glass transition temperatures (Tg (° C.)) of the resins A to E were measured by a DSC method. The glass transition temperatures were measured using a "thermal analysis DSC differential scanning calorimeter, Model Q1000 model" manufactured by TA Instruments Japan Co., Ltd. as a DSC device at a temperature raising rate of 10° C./min.

The monomer structures used for the synthesis of the resins A to E are set forth below.

PHS: Parahydroxystyrene

TBm: t-Butyl methacrylate

St: Styrene

Bzm: Benzyl methacrylate

Bza: Benzyl acrylate

2EtHx: 2-Ethylhexyl methacrylate

TBa: t-Butyl acrylate

Furthermore, specific structures of the resins A to E are set forth below.

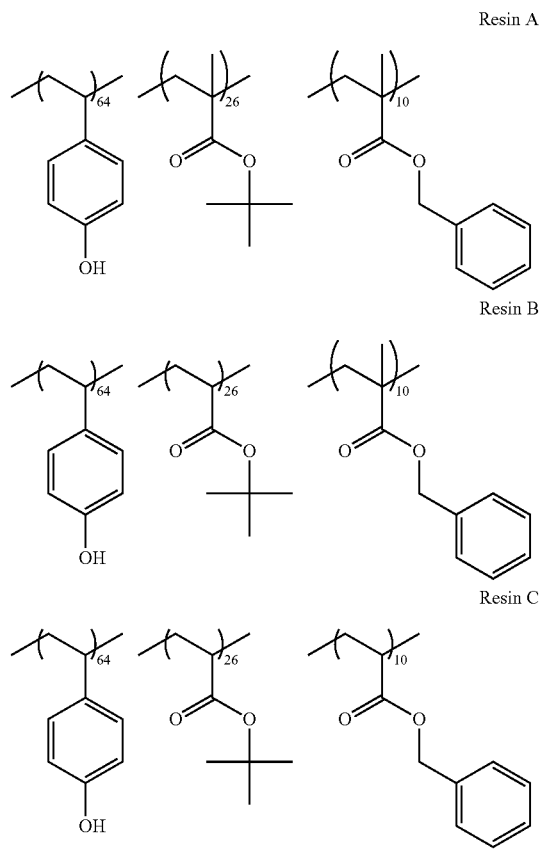

-continued

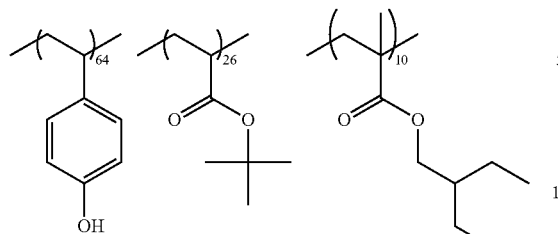
Resin D

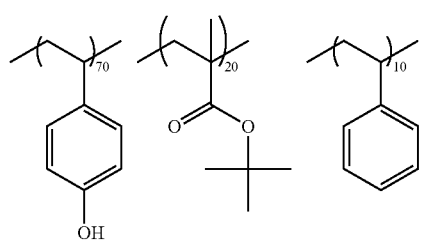
Resin E

<Specific Additives>

The structures of specific additives shown in Table 1 are set forth below. In addition, the specific additives set forth below are all water-soluble.

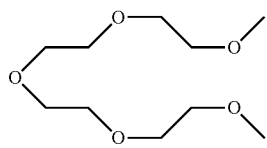

• Tetraethylene glycol dimethyl ether

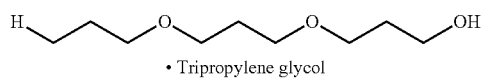

• Tripropylene glycol

<Photoacid Generator>

The structures of photoacid generators shown in Table 1 are set forth below.

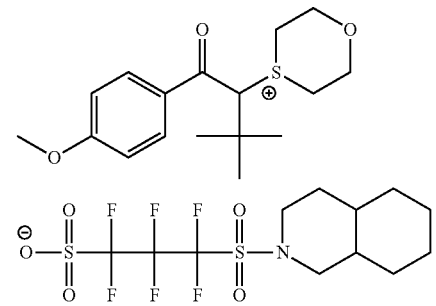

<Acid Diffusion Control Agent>

The structures of acid diffusion control agents shown in Table 1 are set forth below.

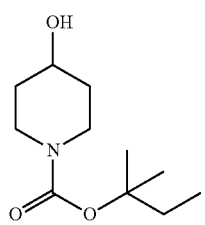

<Surfactant>

The structures of surfactants shown in Table 1 are set forth below.

EGAFAC R-41, manufactured by DIC Corporation

<Solvent>

Solvents shown in Table 1 are set forth below.

PGME: Propylene glycol monomethyl ether

PGMEA: Propylene glycol monomethyl ether acetate

Furthermore, in Table 1, the content (% by mass) of each component means a content with respect to a total solid content.

TABLE 1

| | Actinic ray-sensitive or radiation-sensitive resin composition (resist composition) | | | | | | | |
|---|---|---|---|---|---|---|---|---|
| | Resin | | | | | Photoacid generator Content (% by mass) | Acid diffusion control agent Content (% by mass) | Surfactant Content (% by mass) |
| | Type | Weight-average molecular weight (Mw) | Dispersity (Mw/Mn) | Tg (° C.) | Content (% by mass) | | | |
| Example 1 | Resin E | 18,000 | 1.4 | 170 | 93.68 | 1.13 | 0.05 | 0.14 |
| Example 2 | Resin A | 18,000 | 1.4 | 155 | 93.68 | 1.13 | 0.05 | 0.14 |
| Example 3 | Resin B | 18,000 | 1.4 | 144 | 93.68 | 1.13 | 0.05 | 0.14 |
| Example 4 | Resin C | 18,000 | 1.4 | 140 | 93.68 | 1.13 | 0.05 | 0.14 |
| Example 5 | Resin D | 18,000 | 1.4 | 136 | 83.68 | 1.13 | 0.05 | 0.14 |
| Example 6 | Resin D | 18,000 | 1.4 | 136 | 93.68 | 1.13 | 0.05 | 0.14 |
| Comparative Example 1 | Resin E | 18,000 | 1.4 | 170 | 98.60 | 1.19 | 0.06 | 0.15 |

TABLE 1-continued

| | Actinic ray-sensitive or radiation-sensitive resin composition (resist composition) | | | | | |
|---|---|---|---|---|---|---|
| | Specific additive | | | | | |
| | Type | Melting point (° C.) | Molecular weight | Content (% by mass) with respect to total solid content | Solvent Mass ratio of PGMEA/PGME | Concentration (% by mass) of solid content of resist composition |
| Example 1 | Tetraethylene glycol dimethyl ether | −27 | 222 | 5.00 | 80/20 | 35 |
| Example 2 | Tetraethylene glycol dimethyl ether | −27 | 222 | 5.00 | 80/20 | 35 |
| Example 3 | Tetraethylene glycol dimethyl ether | −27 | 222 | 5.00 | 80/20 | 35 |
| Example 4 | Tetraethylene glycol dimethyl ether | −27 | 222 | 5.00 | 80/20 | 35 |
| Example 5 | Tetraethylene glycol dimethyl ether | −27 | 222 | 5.00 | 80/20 | 35 |
| Example 6 | Tripropylene glycol | −30 | 192 | 5.00 | 80/20 | 35 |
| Comparative Example 1 | — | — | — | — | 80/20 | 35 |

[Various Evaluation]

Measurements set forth below were carried out using each of the resist compositions of Examples and Comparative Examples.

(Measurement of Film Density (g/cm$^3$))

The resist composition was added dropwise to an 8-inch Si substrate (manufactured by Advanced Materials Technology) (hereinafter also referred to as a "substrate") in the state where the substrate was stationary, which had been subjected to a hexamethyldisilazane treatment, using a spin coater "ACT-8" manufactured by Tokyo Electron Limited, while not being provided with an antireflection layer. After the dropwise addition, the substrate was rotated, and the rotation speed was maintained at 500 rpm for 3 seconds, at 100 rpm for 2 seconds, at 500 rpm for 3 seconds, and then at 100 rpm for 2 seconds, and the rotation speed was then increased to a film thickness-setting rotation speed (a rotation speed such that the film thickness reaches 9 μm), which was maintained for 60 seconds. Thereafter, drying under heating was performed on a hot plate at 150° C. for 90 seconds to form a film having a film thickness of 9 μm.

Subsequently, the obtained film having a film thickness of 9 μm was subjected to the following measurements, thereby calculating a film density.

(1) A volume V (cm$^3$) of a film is calculated from a film area on a substrate (an area of a region where the film is formed) and a film thickness (9 μm).

(2) A total mass W1 (g) of the substrate and the film is measured.

(3) The film on the substrate is removed (dissolved and/or peeled) with methanol and a mass W2 (g) of the substrate after removal of the film is measured.

(4) A mass W (g) of the film is determined by subtracting W2 from W1 (W (g)=W1 (g)−W2 (g)).

(5) A film density T at a film thickness of 9 μm is determined by dividing W with V (T (g/cm$^3$)=W (g)/V (cm$^3$)).

The results are shown in Table 2.

(Measurement of Amount (%) of Residual Solvent)

The resist composition was added dropwise to an 8-inch Si substrate (manufactured by Advanced Materials Technology) (hereinafter also referred to as a "substrate") in the state where the substrate was stationary, which was not provided with an antireflection layer, using a spin coater "ACT-8" manufactured by Tokyo Electron Limited. After the dropwise addition, the substrate was rotated, and the rotation speed was maintained at 500 rpm for 3 seconds, at 100 rpm for 2 seconds, at 500 rpm for 3 seconds, and then at 100 rpm for 2 seconds, and the rotation speed was then increased to a film thickness-setting rotation speed (a rotation speed such that the film thickness reaches 9 μm), which was maintained for 60 seconds. Thereafter, drying under heating was performed on a hot plate at 150° C. for 90 seconds to form a film having a film thickness of 9 μm.

Subsequently, the obtained film having a film thickness of 9 μm was peeled from the substrate with a certain amount of methanol, and a sample solution thus dissolved was measured using a gas chromatography device to calculate an amount (%) of residual solvents in the film.

The results are shown in Table 2.

(Evaluation of Ion Leakage upon Ion Implantation)

The resist composition prepared above was added dropwise to an 8-inch Si substrate (manufactured by Advanced Materials Technology) (hereinafter also referred to as a "substrate") in the state where the substrate was stationary, which had been subjected to a hexamethyldisilazane treatment, using a spin coater "ACT-8" manufactured by Tokyo Electron Limited, while not being provided with an antireflection layer. After the dropwise addition, the substrate was rotated, and the rotation speed was maintained at 500 rpm for 3 seconds, at 100 rpm for 2 seconds, at 500 rpm for 3 seconds, and then at 100 rpm for 2 seconds, and the rotation speed was then increased to a film thickness-setting rotation speed (a rotation speed such that the film thickness reaches a value described in Table 2), which was maintained for 60 seconds. Thereafter, drying under heating was performed on a hot plate at 150° C. for 90 seconds to form a resist film having a film thickness (μm) shown in Table 2.

By the procedure, a wafer including a resist film which has a substrate and a solid film of the resist film formed on the substrate was obtained. The wafer including the resist film was used as a wafer for evaluation while not performing exposing and developing treatments.

Subsequently, the wafer for evaluation was subjected to ion implantation and ion leakage was evaluated with regard to the substrate.

Specifically, by an ion implantation method, phosphorus was implanted under the conditions of a dose of $2\times10^{13}$ cm$^{-2}$ and energy of 80 KeV, and then the mask was peeled off. Thereafter, the amount of phosphorus implanted with respect to the substrate was quantified by dynamic secondary ion mass spectrometry (SIMS) analysis. In addition, each of the values of Examples and Comparative Examples was shown as normalized with respect to 1 (reference) of the value of Example 1.

The results are shown in Table 2.

TABLE 2

| | Film thickness (μm) | Film density (g/cm$^3$) | Amount (% by mass) of residual solvent | Amount (normalized value) of ion implanted |
|---|---|---|---|---|
| Example 1 | 9 | 1.05 | 8 | 1 |
| Example 2 | 9 | 1.06 | 6 | 0.97 |
| Example 3 | 9 | 1.08 | 5 | 0.96 |
| Example 4 | 9 | 1.10 | 3 | 0.9 |
| Example 5 | 9 | 1.15 | 2 | 0.88 |
| Example 6 | 9 | 1.17 | 1.5 | 0.85 |
| Comparative Example 1 | 9 | 1.02 | 12 | 1.07 |

From the results in Table 2, it was confirmed that ion leakage is further suppressed upon ion implantation with a pattern formed with the resist composition of Examples including a predetermined amount of the specific additive.

Furthermore, from comparison of Examples 1 to 6, it was confirmed that in a case where the film density is 1.10 or more, ion leakage is further suppressed upon ion implantation.

In addition, from comparison of Examples 1 to 6, it was confirmed that the film density of a pattern thus formed is further improved by incorporating a reactive group (for example, an OH group) that can react with the resin in the molecule into a specific additive.

(Evaluation of Pattern Formation)

The resin composition prepared above was added dropwise to an 8-inch Si substrate (manufactured by Advanced Materials Technology) (hereinafter also referred to as a "substrate") in the state where the substrate was stationary, which had been subjected to a hexamethyldisilazane treatment, using a spin coater "ACT-8" manufactured by Tokyo Electron Limited, while not being provided with an antireflection layer. After the dropwise addition, the substrate was rotated, and the rotation speed was maintained at 500 rpm for 3 seconds, at 100 rpm for 2 seconds, at 500 rpm for 3 seconds, and then at 100 rpm for 2 seconds, and the rotation speed was then increased to a film thickness-setting rotation speed (a rotation speed such that the film thickness reaches a value described in Table 2), which was maintained for 60 seconds. Thereafter, drying under heating was performed on a hot plate at 150° C. for 90 seconds to form a resist film having a film thickness (μm) shown in Table 2.

The resist film was subjected to patternwise exposure through a mask having a line-and-space pattern such that a space width and a pitch width of a pattern formed after reduction projection exposure and development became is 5 μm and 25 μm, respectively, under exposure conditions of NA=0.60 and σ=0.75, using a KrF excimer laser scanner (manufactured by ASML, PAS5500/850 C. wavelength 248 nm). After irradiation, the resist film was baked at 120° C. for 60 seconds, immersed in a 2.38%-by-mass aqueous tetramethylammonium hydroxide (TMAH) solution for 60 seconds, then rinsed with pure water and dried for 30 seconds, and then baked at 110° C. for 60 seconds to form an isolated space pattern with a space width of 5 μm and a pitch width of 25 μm.

It was confirmed that a pattern having excellent linearity can be formed with any of the resist compositions of Examples 1 to 6.

What is claimed is:

1. An actinic ray-sensitive or radiation-sensitive resin composition for forming a pattern used as a mask in an ion implanting, comprising:
   a resin including a repeating unit having an acid-decomposable group;
   a photoacid generator; and
   an additive having a melting point or glass transition temperature of lower than 25° C. and a molecular weight of 180 or more,
   wherein the content of the additive is 1% by mass or more with respect to the total solids content in the composition,
   the glass transition temperature of the resin is 144 ° C. or lower, and
   the content of the resin is 60% by mass or more with respect to the total solids content of the composition.

2. The actinic ray-sensitive or radiation-sensitive resin composition according to claim 1,
   wherein a film thickness of the pattern is 5 μm or more.

3. The actinic ray-sensitive or radiation-sensitive resin composition according to claim 1,
   wherein a film thickness of the pattern is 7 μm or more.

4. The actinic ray-sensitive or radiation-sensitive resin composition according to claim 1,
   wherein the concentration of the solids content in the composition is 20% by mass or more.

5. The actinic ray-sensitive or radiation-sensitive resin composition according to claim 1,
   wherein a film density of the pattern is 1.05 g/cm$^3$ or more, and
   the film density is a film density of a film having a film thickness of 9 μm obtained by applying the actinic ray-sensitive or radiation-sensitive resin composition onto a substrate to form a coating film, and then baking the coating film at 150° C. for 90 seconds.

6. The actinic ray-sensitive or radiation-sensitive resin composition according to claim 5,
   wherein the film density is 1.10 g/cm$^3$ or more.

7. The actinic ray-sensitive or radiation-sensitive resin composition according to claim 1,
   wherein the additive is water-soluble.

8. The actinic ray-sensitive or radiation-sensitive resin composition according to claim 1,
   wherein the ion implanting is an ion implanting for forming a light receiving portion for an infrared transmitting filter that selectively transmits an infrared ray component in a manufacture of a solid-state imaging element including the infrared transmitting filter.

9. The actinic ray-sensitive or radiation-sensitive resin composition according to claim 1,
   wherein the additive includes a compound having a poly(oxyalkylene) structure.

10. The actinic ray-sensitive or radiation-sensitive resin composition according to claim 1,
wherein the photoacid generator includes a compound represented by General Formula (ZI-3),

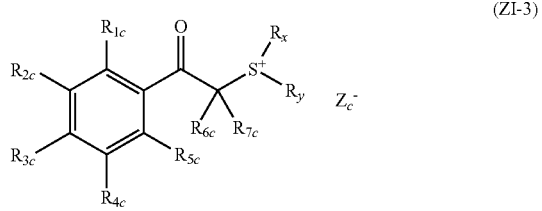

in General Formula (ZI-3),
$R_{1c}$ to $R_{5c}$ each independently represents a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group,
$R_{6c}$ and $R_{7c}$ each independently represents a hydrogen atom, an alkyl group, a cycloalkyl group, a halogen atom, a cyano group, or an aryl group,
$R_x$ and $R_y$ each independently represents an alkyl group, a cycloalkyl group, a 2-oxoalkyl group, a 2-oxocycloalkyl group, an alkoxycarbonylalkyl group, an allyl group, or a vinyl group,
any two or more of $R_{1c}$ to $R_{5c}$, $R_{5c}$ and $R_{6c}$, $R_{6c}$ and $R_{7c}$, $R_{5c}$ and $R_x$, or $R_x$ and $R_y$ may be bonded to each other to form a ring structure, and
$Z_c^-$ represents an anion.

11. The actinic ray-sensitive or radiation-sensitive resin composition according to claim 1, further comprising:
an acid diffusion control agent that includes a compound represented by General Formula (6),

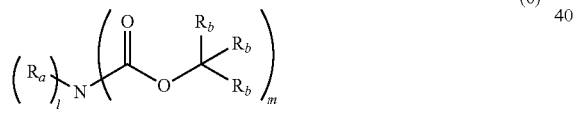

in General Formula (6),
l represents an integer of 0 to 2, m represents an integer of 1 to 3, and l+m=3 is satisfied,
$R_a$ represents a hydrogen atom, an alkyl group, a cycloalkyl group, an aryl group, or an aralkyl group,
in a case where l is 2, two $R_a$'s may be the same as or different from each other, and two $R_a$'s may be linked to each other to form a heterocycle together with the nitrogen atom in the formula, and the heterocycle may include a heteroatom other than the nitrogen atom in the formula,
$R_b$'s each independently represent a hydrogen atom, an alkyl group, a cycloalkyl group, an aryl group, an aralkyl group, or an alkoxyalkyl group, and $R_b$'s may be linked to each other to form a ring.

12. A resist film formed with the actinic ray-sensitive or radiation-sensitive resin composition according to claim 1.

13. A pattern forming method comprising:
forming a resist film with the actinic ray-sensitive or radiation-sensitive resin composition according to claim 1;
exposing the resist film; and
developing the exposed resist film with a developer.

14. A method for manufacturing a solid-state imaging element, the method comprising:
the pattern forming method according to claim 13, and
an ion implanting of forming a light receiving portion that senses infrared rays, by implanting ions into an unmasked region of a substrate with a pattern formed on the substrate as a mask;
removing the pattern from the substrate; and
disposing an infrared transmitting filter layer on an ion-implanted region of the substrate.

15. The actinic ray-sensitive or radiation-sensitive resin composition according to claim 1,
wherein the weight-average molecular weight of the resin is 10,000 to 25,000, and
the additive includes a compound having a poly(oxyalkylene) structure.

16. The actinic ray-sensitive or radiation-sensitive resin composition according to claim 1,
wherein the additive has a poly(oxyalkylene) structure, and
the content of the additive is 1% to 5% by mass with respect to the total solids content of the composition.

17. The actinic ray-sensitive or radiation-sensitive resin composition according to claim 1, further comprising:
an acid diffusion control agent,
wherein the photoacid generator includes a compound represented by General Formula (ZI-3),

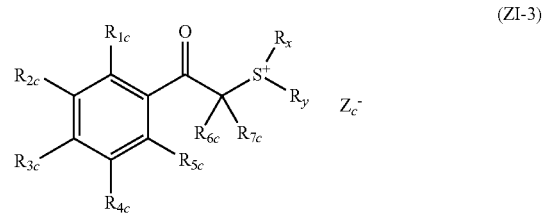

in General Formula (ZI-3),
$R_{1c}$ to $R_{5c}$ each independently represents a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group,
$R_{6c}$ and $R_{7c}$ each independently represents a hydrogen atom, an alkyl group, a cycloalkyl group, a halogen atom, a cyano group, or an aryl group,
$R_x$ and $R_y$ each independently represents an alkyl group, a cycloalkyl group, a 2-oxoalkyl group, a 2-oxocycloalkyl group, an alkoxycarbonylalkyl group, an allyl group, or a vinyl group,
any two or more of $R_{1c}$ to $R_{5c}$, $R_{5c}$ and $R_{6c}$, $R_{6c}$ and $R_{7c}$, $R_{5c}$ and $R_x$, or $R_x$ and $R_y$ may be bonded to each other to form a ring structure, and
$Z_c^-$ represents an anion, and
the acid diffusion control agent includes a compound represented by General Formula (6),

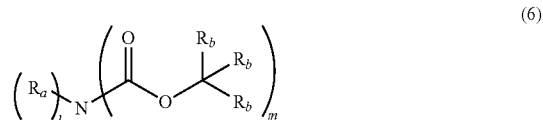

in General Formula (6),
l represents an integer of 0 to 2, m represents an integer of 1 to 3, and l+m=3 is satisfied, $R_a$ represents a hydrogen atom, an alkyl group, a cycloalkyl group, an aryl group, or an aralkyl group, in a case where 1 is 2, two $R_a$'s may be the same as or different from each other, and two $R_a$'s may be linked to each other to form a heterocycle together with the nitrogen atom in the formula, and the heterocycle may include a heteroatom other than the nitrogen atom in the formula, and $R_b$'s each independently represent a hydrogen atom, an alkyl group, a cycloalkyl group, an aryl group, an aralkyl group, or an alkoxyalkyl group, and $R_b$'s may be linked to each other to form a ring.

* * * * *